US009059344B2

(12) United States Patent
Wang et al.

(10) Patent No.: US 9,059,344 B2
(45) Date of Patent: Jun. 16, 2015

(54) NANOWIRE-BASED PHOTOVOLTAIC ENERGY CONVERSION DEVICES AND RELATED FABRICATION METHODS

(75) Inventors: Shih-Ping Wang, Los Altos, CA (US); Nobuhiko Kobayashi, Sunnyvale, CA (US); Yu-Min Houng, Cupertino, CA (US)

(73) Assignee: Shih-Ping Bob Wang, Los Altos, CA (US)

( * ) Notice: Subject to any disclaimer, the term of this patent is extended or adjusted under 35 U.S.C. 154(b) by 375 days.

(21) Appl. No.: 13/261,289

(22) PCT Filed: Aug. 23, 2010

(86) PCT No.: PCT/US2010/046334
§ 371 (c)(1),
(2), (4) Date: Nov. 5, 2012

(87) PCT Pub. No.: WO2011/025733
PCT Pub. Date: Mar. 3, 2011

(65) Prior Publication Data
US 2013/0068286 A1    Mar. 21, 2013

Related U.S. Application Data

(60) Provisional application No. 61/236,144, filed on Aug. 24, 2009, provisional application No. 61/263,315, filed on Nov. 20, 2009, provisional application No. 61/264,194, filed on Nov. 24, 2009, provisional application No. 61/295,579, filed on Jan. 15, 2010, provisional application No. 61/295,500, filed on Jan. 15, 2010, provisional application No. 61/295,606, filed on Jan. 15, 2010, provisional application No. 61/309,414, filed on Mar. 1, 2010.

(51) Int. Cl.
*H01L 31/0224* (2006.01)
*H01L 31/0352* (2006.01)

(52) U.S. Cl.
CPC .............................. *H01L 31/035227* (2013.01)

(58) Field of Classification Search
CPC ................ H01L 31/00; H01L 31/0224; H01L 31/022425; H01L 31/022466; H01L 31/022475; H01L 31/022483; H01L 31/035281; H01L 31/18; H01L 31/1892; H01L 31/1884
USPC .................................................. 136/256, 258
See application file for complete search history.

(56) References Cited

U.S. PATENT DOCUMENTS

| | | | |
|---|---|---|---|
| 8,420,978 B2 * | 4/2013 | Jain et al. ................ | 219/121.69 |
| 2008/0223514 A1 * | 9/2008 | Hantschel et al. ............ | 156/278 |
| 2009/0189145 A1 * | 7/2009 | Wang et al. .................... | 257/14 |

*Primary Examiner* — Christina Chern
(74) *Attorney, Agent, or Firm* — Cooper & Dunham LLP

(57) ABSTRACT

Nanowire-based photovoltaic energy conversion devices and related fabrication methods therefor are described. A plurality of photovoltaic (PV) nanowires extend outwardly from a surface layer of a substrate, each PV nanowire having a root end near the substrate surface layer and a tip end opposite the root end. For one preferred embodiment, a canopy-style tip-side electrode layer contacts the tip ends of the PV nanowires and is separated from the substrate surface layer by an air gap layer, the PV nanowires being disposed within the air gap layer. For another preferred embodiment, a tip-side electrode layer is disposed upon a layer of optically transparent, electrically insulating solid filler material that laterally surrounds the PV nanowires along a portion of their lengths, wherein an air gap is disposed between the solid filler layer and the substrate surface layer. Methods for fabricating the nanowire-based photovoltaic energy conversion devices are also described.

3 Claims, 17 Drawing Sheets

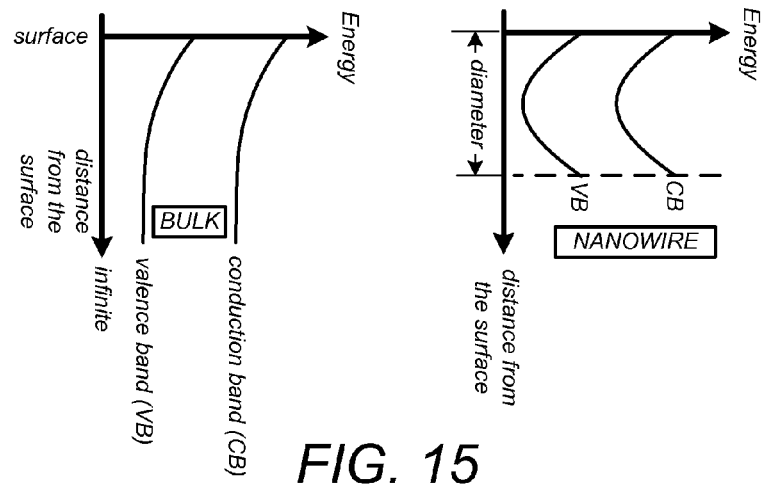
FIG. 15
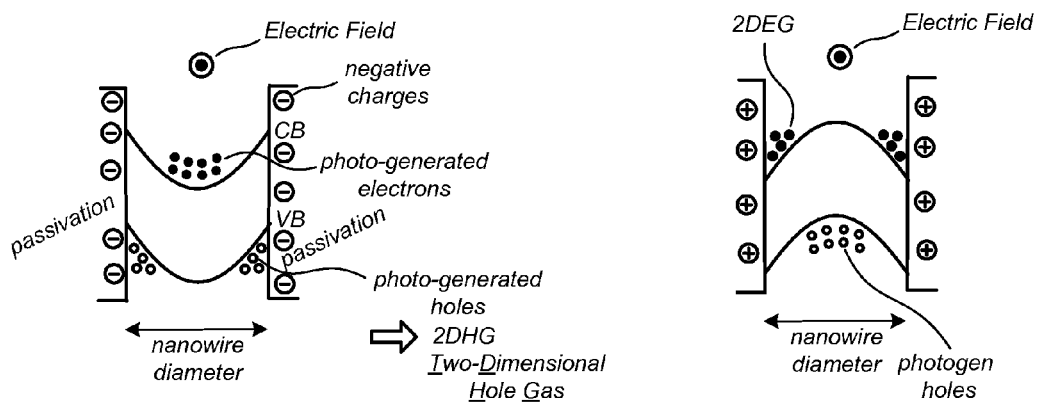
FIG. 16A
FIG. 16B

MICROWIRES ON GLASS

MICROWIRES GROWN ON p-TYPE a-Si

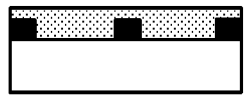
1. Print electrodes and deposit n-type TCO on glass

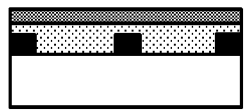
2. Deposit p-type a-Si:H on TCO, spray catalyst

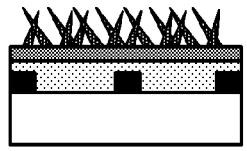
3. Grow micro-wires on p-type a-Si:H

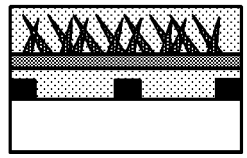
4. Apply passivation agent and transparent filler

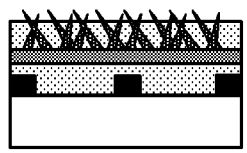
5. Etch back filler to expose stubs of microwires

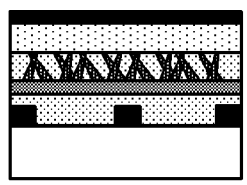
6. Deposit n-type a-Si-H and "bottom" conductor/reflector

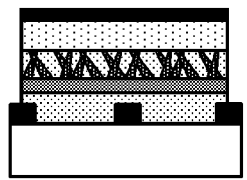
7. Print "bottom" electrodes $hc/\lambda$   $hc/\lambda$

FIG. 18

NANOWIRE-BASED PHOTOVOLTAIC ENERGY CONVERSION DEVICES AND RELATED FABRICATION METHODS

This application is being filed on 23 Aug. 2010 as a PCT International Patent application in the name of International Solartech, Inc., a US national corporation, applicant for the designation of all countries except the US, and Shih-Ping Wang, a citizen of the US, Nobuhiko Kobayashi, a citizen of Japan, and Yu-Min Houng, a citizen of the US, applicants for the designation of the US only.

CROSS-REFERENCE TO RELATED APPLICATIONS

This application claims the benefit of each of the following U.S. provisional patent applications: U.S. Prov. Ser. No. 61/236,144, filed 24 Aug. 2009; U.S. Prov. Ser. No. 61/263,315, filed 20 Nov. 2009; U.S. Prov. Ser. No. 61/264,194, filed 24 Nov. 2009; U.S. Prov. Ser. No. 61/295,500, filed 15 Jan. 2010; U.S. Prov. Ser. No. 61/295,579, filed 15 Jan. 2010; U.S. Prov. Ser. No. 61/295,606, filed 15 Jan. 2010; and U.S. Prov. Ser. No. 61/309,414, filed 1 Mar. 2010. Each of the above-referenced U.S. provisional patent applications is incorporated by reference herein.

FIELD

This patent specification relates to photovoltaic energy conversion devices, such as may be used in photovoltaic solar cells and solar panels. More particularly, this patent specification relates to nanowire-based photovoltaic energy conversion devices, as well as systems and methods for fabricating such devices.

BACKGROUND

Solar electric power generation systems, particularly those based on photovoltaic solar panels, continue to gain popularity in efforts to shift away from supply-limited, greenhouse-gas producing fossil fuels to more environmentally friendly and sustainable forms of energy. Most of today's conventional rooftop photovoltaic solar panels comprise side-by-side arrangements of relatively large (e.g., 5 cm×5 cm, 10 cm×10 cm) bulk monocrystalline or bulk multicrystalline silicon wafers processed to form depthwise p-n junctions. Manufacture of the bulk crystalline silicon wafers is highly energy-intensive and expensive, and the power conversion efficiency of the resultant devices is typically only in the range of 15% to 20%. A chronic shortage in the supply of bulk crystalline silicon wafers has plagued the industry in recent years, a shortage that is expected by some forecasters to reach crisis proportions in coming years. Although thin-film photovoltaic cells fabricated from amorphous silicon or chalcogenide compounds require less semiconductor material than those based on bulk crystalline silicon wafers and are less energy-intensive and less costly to produce, their power conversion efficiencies are even lower, usually in the 6% to 10% range.

Proposals have been set forth for using semiconducting nanowires as a basis for photovoltaic solar energy conversion. Nanowires are small self-assembled structures having lengths typically in the range of 0.5 µm-5 µm and diameters typically in the range of 10 nm-500 nm. One method of fabricating nanowires uses a vapor-liquid-solid ("VLS") synthesis process, sometimes termed a catalytic growth process. A catalyst material such as gold or titanium is deposited on a substrate at a large number of spots thereacross, each spot being a location at which a nanowire will be grown. The substrate with the catalyst is then placed in a reaction chamber and heated to high temperatures (e.g., 250° C.-1000° C.). Precursor gases, including the elements or compounds that will form the nanowires, are introduced into the chamber. Under the influence of the catalyst, the precursor gases at least partially decompose into their respective elements, some of which are transported on or through the catalyst in liquified phase to the immediately underlying solid surface provided by the substrate. At each spot, a nanowire epitaxially grows outwardly from the substrate as the process proceeds, the catalyst at each spot remaining at the tip of the nanowire and rising away from surface of the substrate as the nanowire grows. The resultant nanowires exhibit a long-range atomic order (i.e., single-crystal) that can potentially be exploited for a variety of different useful applications. So-called self-catalytic growth of nanowires has also been reported in the literature.

During nanowire formation, the elements or compounds used to form the nanowires can be varied, such that the material composition and/or semiconductor doping level of each nanowire is variable along the longitudinal length of that nanowire. In one known scenario relevant to the preferred embodiments herein, the longitudinally varying material and/or doping profile can be designed such that each nanowire exhibits a photovoltaic property, i.e., is capable of absorbing incident photons and providing an associated photocurrent to an external load (if properly electrically connected to that load). As used herein, PV nanowire refers to any of a variety of nanowires themselves or related structures that employ nanowires and are capable of exhibiting photovoltaic properties, such photovoltaic properties arising from any of a variety of different material selections, material compositional and spatial chemical profiles, and/or doping profiles thereof. By way of non-limiting example, PV nanowires can comprise one or more longitudinal homojunctions (e.g., p-n, p-i-n, p-n-p, n-p-n homojunctions), one or more longitudinal heterojunctions (e.g., materials containing various chemical elements and/or various chemical compositions), and/or portions of such homojunctions or heterojunctions that are completed by virtue of the materials and/or doping profiles immediately opposite the longitudinal end(s) of the nanowire. One example of a PV nanowire-based solar cell is described in US 2007/0267625 A1, which is incorporated by reference herein.

Advantageously, PV nanowire-based solar cells can provide power conversion efficiencies that are as great, or even greater, than solar cells based on bulk crystalline wafers made of a same material. For example, it is believed at least theoretically possible to achieve PV nanowire-based solar cells composed of III-V semiconductor material having 35 percent, and perhaps even 40 percent, energy conversion efficiency, which is as high or better than photovoltaic cells made with bulk crystalline semiconductor wafers. At the same time, because they can be built upon low-cost substrates with low material utilization and comparatively low energy requirements, PV nanowire-based solar cells can be fabricated at a fraction of the cost of comparable solar cells based on bulk crystalline wafers.

One or more issues arises in the design and/or fabrication of PV nanowire-based solar cells that is at least partially resolved by one or more of the preferred embodiments described herein. One issue that arises in PV nanowire-based solar cells relates to the need for an electrode to be provided on each side of the PV nanowire array, including a root-side electrode corresponding to the roots of the PV nanowires and a tip-side electrode corresponding to the tips of the PV nanowires. The need to provide good electrical contact and conductivity at these electrodes can present substantial limitations on the type, complexity, and orientation of the overall PV nanowire-based solar cells, because structures providing the good electrical contact and conductivity can often prove to be light-absorbing or light-reflecting, thereby reducing the percentage of photons able to reach the PV nanowire junctions. Another issue that can arise in PV nanowire-based solar cells relates to the material content, other than the PV nanowires themselves, of the space between the root-side electrode and tip-side electrode. In US 2007/0267625 A1, supra, a layer of insulating material is provided that fully occupies the space (other than the PV nanowires themselves) between the root-side electrode and tip-side electrode. Although the layer of insulator material can serve a useful function as a general support for the tip-side electrode as well as lateral support for the PV nanowires, it can possibly be disadvantageous over the long run, in that it may physically and/or chemically degrade with long-term solar exposure. By virtue of this degradation, the insulator material could "darken," absorbing larger percentages of photons, dissipating that energy into heat, and reducing the power efficiency of the solar cell. Electrical shorts or efficiency-draining hot spots might also result from the degradation of the insulator material.

One issue that can affect the performance of PV nanowire-based solar cells is carrier loss due to charge recombination occurring along the surface of the PV nanowires. Charge recombination is a loss process in which an electron, which has been photo-excited from the valence band to the conduction band of a semiconductor, falls back into an empty state (hole) in the valence band. Charges that recombine do not produce any photocurrent and, hence, do not contribute toward solar cell efficiency. Charge recombination losses can be particularly strong along the surface of a semiconductor material, where dangling bonds give rise to certain surface states that greatly facilitate the electron-hole recombination process. Because the recombination losses associated with surfaces scale with total surface area, the problem becomes particularly amplified for nanowires having high surface-to-volume ratio. Generally speaking, the recombination losses at surfaces tend to be more problematic for III-V compound semiconductor PV nanowires than for silicon PV nanowires for which stable natural oxide (i.e., $SiO_2$) that can be easily formed on Si surfaces can greatly reduce the density of surface states. Other issues arise as would be apparent to one skilled in the art upon reading the present disclosure.

SUMMARY

Provided according to one preferred embodiment is a method for fabricating a photovoltaic energy conversion device, comprising providing a substrate and growing a plurality of photovoltaic (PV) nanowires outwardly from a surface layer of the substrate. Each PV nanowire has a root end near the substrate surface layer and a tip end opposite the root end. A canopy-style tip-side electrode is then formed that contacts the tip ends of the PV nanowires. Formation of the canopy-style tip-side electrode comprises forming a layer of sacrificial material having a surface that covers the tips of the PV nanowires, forming a layer of electrically conductive material upon the surface of the sacrificial material layer, and removing the sacrificial material layer. The layer of electrically conductive material settles into contact with the tip ends of the PV nanowires to form the canopy-style tip-side electrode, and an air gap layer remains that laterally surrounds the PV nanowires between the substrate surface layer and the layer of electrically conductive material.

Provided according to another preferred embodiment is a photovoltaic energy conversion device, comprising a substrate having an electrically conductive substrate surface layer and a plurality of PV nanowires extending outwardly from a surface layer of the substrate. Each PV nanowire has a root end near the substrate surface layer and a tip end opposite the root end. The substrate surface layer is electrically conductive and forms a root-side electrode layer of the device. The device further comprises a canopy-style tip-side electrode layer in contact with the tip ends of the PV nanowires. The canopy-style tip-side electrode layer is separated from the substrate surface layer by an air gap layer, the PV nanowires being disposed within the air gap layer.

Provided according to another preferred embodiment is a method for fabricating a photovoltaic energy conversion device, comprising providing a substrate and growing a plurality of PV nanowires outwardly from a surface layer of the substrate. Each PV nanowire has a root end near the substrate surface layer and a tip end opposite the root end. A layer of optically transparent, electrically insulating solid filler material is formed that laterally surrounds the PV nanowires along a portion of their lengths. The formation of the solid filler layer is carried out such that (i) an air gap remains between the substrate surface layer and an inwardly facing surface of the solid filler layer, and (ii) the tip ends of the PV nanowires are juttably exposed beyond an outwardly facing surface of the solid filler layer. A tip-side electrode is then formed upon the outwardly facing surface of the solid filler layer in contact with the tip ends of the PV nanowires.

Provided according to another preferred embodiment is a photovoltaic energy conversion device, comprising a substrate having an electrically conductive substrate surface layer and a plurality of PV nanowires extending outwardly from a surface layer of the substrate. Each PV nanowire has a root end near the substrate surface layer and a tip end opposite the root end. The substrate surface layer is electrically conductive and forms a root-side electrode layer of the device. The device further comprises a layer of optically transparent, electrically insulating solid filler material laterally surrounding the PV nanowires along a portion of their lengths. A tip-side electrode layer is disposed upon an outwardly facing surface of the solid filler layer. Preferably, the tip ends of the PV nanowires jut outwardly beyond the outwardly facing surface of the solid filler layer into physical and electrical contact with the tip-side electrode layer, and an air gap is disposed between the substrate surface layer and an inwardly facing surface of the solid filler layer.

BRIEF DESCRIPTION OF THE DRAWINGS

FIGS. 15 and 16A-B illustrate energy band diagrams corresponding to a PV nanowire formed according to the method of FIG. 14;

FIG. 18 illustrates fabricating a PV nanowire-based solar cell according to a preferred embodiment;

DETAILED DESCRIPTION

Figure 1A:
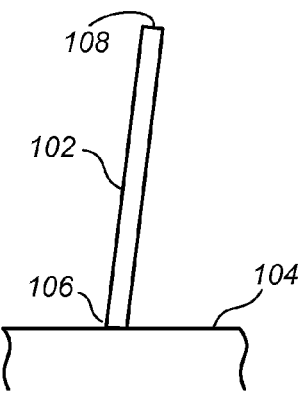
FIGS. 1A-1B illustrate a photovoltaic (PV) nanowire that may be used in conjunction with one or more preferred embodiments.
Figure 1B:
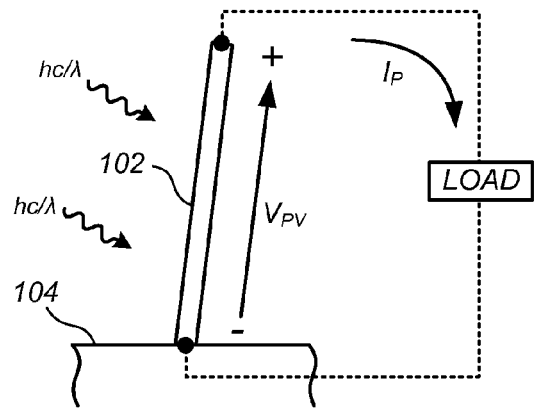

FIGS. 1A-1B illustrate a photovoltaic (PV) nanowire 102 that is representative of a wide variety of different PV nanowires for which one or more of the preferred embodiments described hereinbelow is applicable. The PV nanowire 102 extends outwardly from a substrate 104 and includes a base region 106 (sometimes termed a "root") near the substrate 104 and a tip region 108 at the opposite end. When photons having energies $hc/\lambda$ (where h is Planck's constant, c is the speed of light, and $\lambda$ is the photon wavelength) impinge upon the PV nanowire 102, at least a portion of the photons are absorbed and, if the PV nanowire 102 is properly electrically connected to an external load, a photocurrent $I_P$ will be sourced by the PV nanowire 102 at a predetermined voltage $V_{PV}$ according to the material structure(s), bandgap(s), and doping level(s) thereof. On the other hand, if the tip region 108 and base region 106 are not in operative electrical coupling with the external load, the energy of the absorbed photons will not be harnessed into useful electrical power, but rather will be dissipated as heat. Accordingly, for a solar cell device based upon a large population of PV nanowires such as the PV nanowire 102, it is desirable to achieve operable electrical coupling for as large a percentage of the PV nanowires as possible.

For a solar cell device based upon a large population of PV nanowires such as the PV nanowire 102, one or more of the preferred embodiments is directed to providing reliable electrical coupling between an operatively large percentage of the PV nanowires and the overall positive and negative electrical nodes of the solar cell. For convenience of description herein, the tips of the nanowires will be associated with the "positive" or "top" electrical node of the solar cell, while the bases will be associated with the "negative" or "bottom" electrical node of the solar cell. It is to be readily understood that the "positive" and "negative" electrical polarities can of course be reversed depending on the material structures and doping profiles of the PV nanowires. For one or more of the examples presented herein, the "top" direction corresponds to an outward direction relative to a surface of the substrate from which the PV nanowires are grown. However, it is to be appreciated that the terms "top" and "bottom" are used for convenience of description and do not imply any particular orientation relative to gravity, nor do they imply any particular direction of solar radiation entry into the PV nanowire array.

One or more aspects of the preferred embodiments described in the instant specification may be further understood in view of selected background references from the non-patent literature identified in the list that follows. The listed references, each of which is incorporated by reference herein, are referenced further hereinbelow by their respective identifying numerals.

{1} Kobayashi, et. al., "Metal Organic Chemical Vapor Deposition of Indium Phosphide Nanoneedles on Non-Single Crystal Silicon Surfaces," Proc. SPIE, Vol. 6370, 63700S-1-8 (2006);

{2} Kobayashi, et. al., "Growth and Characterization of Indium Phosphide Single-Crystal Nanoneedles on Microcrystalline Surfaces," Appl. Phys. A, Vol. 85, 1-6 (2006);

{3} Kobayashi, et. al., "Ensembles of Indium Phosphide Nanowires: Physical Properties And Functional Devices Integrated On Non-Single Crystal Platforms," Appl. Phys. A, Vol. 95, 1005-1013 (2009);

{4} Goto, et. al., "Growth of Core-Shell InP Nanowires for Photovoltaic Application by Selective-Area Metal Organic Vapor Phase Epitaxy," Applied Physics Express 2, 035004-1-3 (2009);

{5} Singh, et. al., "Reduction in Surface Charge Density By New GaAs Passivation Method," J. Phys. D: Appl. Phys., Vol. 8, L42-43 (1975);

{6} Kalhor, et. al., "Annealing Effects on Opto-electronic Properties of Thermally-Evaporated ITO/Ag/ITO Multilayered Films for Use in Color Filter Electrodes," World Applied Sciences Journal 6 (1): 83-87 (2009);

{7} Perkins, et. al., "Combinatorial Optimization of Transparent Conducting Oxides (TCOs) for PV," $31^{st}$ IEEE Photovoltaics Specialists Conference and Exhibition, Lake Buena Vista, Fla., Jan. 3-7, 2005, NREL/CP 520-37420 (2005);

{8} Pern, et. al., "Accelerated Exposure Tests of Encapsulated Si Solar Cells and Encapsulation Materials," National Center for Photovoltaics Program Review Meeting, Denver, Colo., Sep. 8-11, 1998, NREL/CP-520-25361 (1998);

{9} Guillen, et. al., "ITO/Metal/ITO Multilayer Structures Based On Ag and Cu Metal Films for High Performance Transparent Electrodes," Solar Energy Materials and Solar Cells, Vol. 92, Issue 8, pp. 938-941 (2008);

{10} Iyer, R., "Sulfur as a Surface Passivation for InP," Appl. Phys. Lett. 53 (2) (1988);

{11} Voyles, et. al., "Absence of an Abrupt Phase Change from Polycrystalline to Amorphous in Silicon with Deposition Temperature," Phys. Rev. Lett. 86 (24), pp. 5514-5517 (2001); and {12} Gao, L., et. al., "Self-Catalyzed Epitaxial Growth of Vertical Indium Phosphide Nanowires on Silicon," Nano Lett. 9 (6), pp 2223-2228 (2009).

PV nanowires can be formed (e.g., catalytically grown or otherwise generated) upon substrates having different types of surface characteristics. PV nanowires can, of course, be formed upon substrates that exhibit long-range crystallographic order along their surfaces, including cost-intensive bulk crystalline wafer substrates. However, as described in {2}-{3}, supra, PV nanowires can also be formed upon substrates that do not exhibit long-range crystallographic order along their surfaces, but that do exhibit short-range crystallographic order along their surfaces at the locations of the nanowires to be formed. For purposes of the present description, the term short range atomic order (SRAO) is used interchangeably with the term short range crystallographic order. The material providing the short-range atomic order, termed herein SRAO material, can be different or the same as the underlying material that forms the bulk of the substrate. When different from the underlying substrate material, the SRAO material can be formed as a very thin layer thereupon, which can be termed a template layer. Advantageously, the substrate material underlying the SRAO template layer can be any material suitable to provide mechanical support for the SRAO template layer regardless of the presence or absence of crystalline character, provided only that its properties are otherwise consistent with the purpose of the apparatus to be built. By way of example, the bulk of the substrate can comprise amorphous silicon dioxide quartz, stainless steel, or chromium. By way of example, the SRAO template layer can be a 100-nm thick film of hydrogenated amorphous silicon or hydrogenated microcrystalline silicon.

If the PV nanowires are formed upon a substrate whose surface exhibits long range atomic order, it is more likely that a high percentage of the nanowires will be in geometric alignment with each other and that their tips will rise to similar heights above the substrate surface. If the PV nanowires are formed upon a substrate having an short range atomic order (SRAO) material surface, the population of PV nanowires will be more likely to have a lesser degree of alignment due to the multiple different crystallographic directions imposed upon the population of PV nanowires, and there will be greater variation in the heights of their tips above the substrate surface. The preferred PV nanowire-coupling fabrication methods described hereinbelow are presented in the context of PV nanowires formed upon substrates having SRAO material surfaces. In addition to representing the more difficult (and more general) case due to greater variation in PV nanowire tip heights, the latter also represents a more commercially desirable case due to the availability of lower-cost fabrication processes, such as roll-based manufacturing processes, associated with the wide flexibility in bulk substrate material choices. It is nevertheless to be appreciated, however, that the described methods are readily applicable in the context of PV nanowires formed upon substrates whose surfaces exhibit long range atomic order, such as bulk crystalline wafer substrates.

Figure 2:
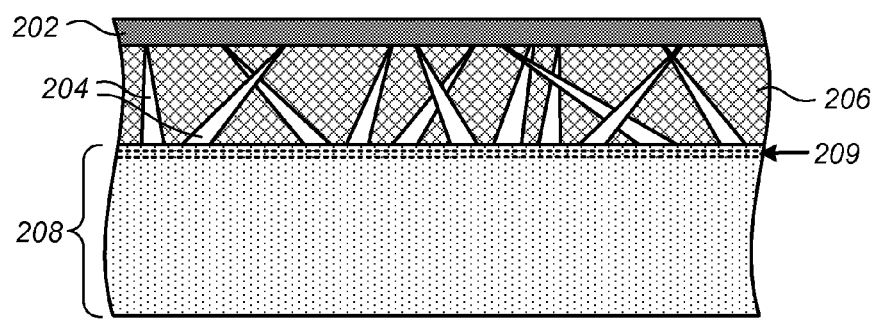
FIG. 2 illustrates a cross-sectional view of a PV nanowire-based solar cell according to the prior art.

FIG. 2 illustrates a cross-sectional view of one approach for achieving electrical connectivity between the overall electrical nodes of a PV nanowire-based solar cell and its individual PV nanowires according to the prior art, which is similar to one method discussed in US 2007/0267625 A1, supra. PV nanowires 204 extend outwardly from a substrate 208, the substrate 208 including a template layer 209 along its surface comprising a short-range atomic order (SRAO) material. The PV nanowires 204 can exhibit a nanoneedle shape (narrower at the top than at the bottom), as disclosed in {1}, supra, if the template layer 209 comprises hydrogenated amorphous silicon or hydrogenated microcrystalline silicon. The template layer 209 can be processed to be electrically conductive, for example by n-doping or p-doping, if the SCRO surface material comprises a semiconductor material such as hydrogenated amorphous silicon or hydrogenated microcrystalline silicon, and therefore can serve as the bottom electrical node of the solar cell. The PV nanowires 204 are laterally surrounded by a layer of insulator material 206, which in turn supports a layer 202 of gold-germanium, gold-zinc, gold-silicon, or other ohmic metal material formed thereacross in contact with the tips of the PV nanowires 204, thereby forming a top electrical node of the solar cell. Although the layer of insulator material 206 serves a useful function as a general support for the top electrical node, the presence of the insulator material 206 can possibly be disadvantageous over the long run, in that it may physically and/or chemically degrade with long-term solar exposure. As discussed above, by virtue of this degradation, the insulator material 206 could "darken," absorbing larger percentages of photons, dissipating that energy into heat, and reducing the power efficiency of the solar cell. Advantageously, PV nanowire-based solar cells according to one or more preferred embodiments herein provide either a reduction in the adverse effects of such darkening (and/or other adverse effects brought about the insulator material 206) by reduction in the amount of insulating material encountered by the solar radiation as it impinges upon the PV nanowires, or a substantial elimination of such effects by substantial elimination of such insulator material between the root-side and tip-side electrodes.

Figure 3:
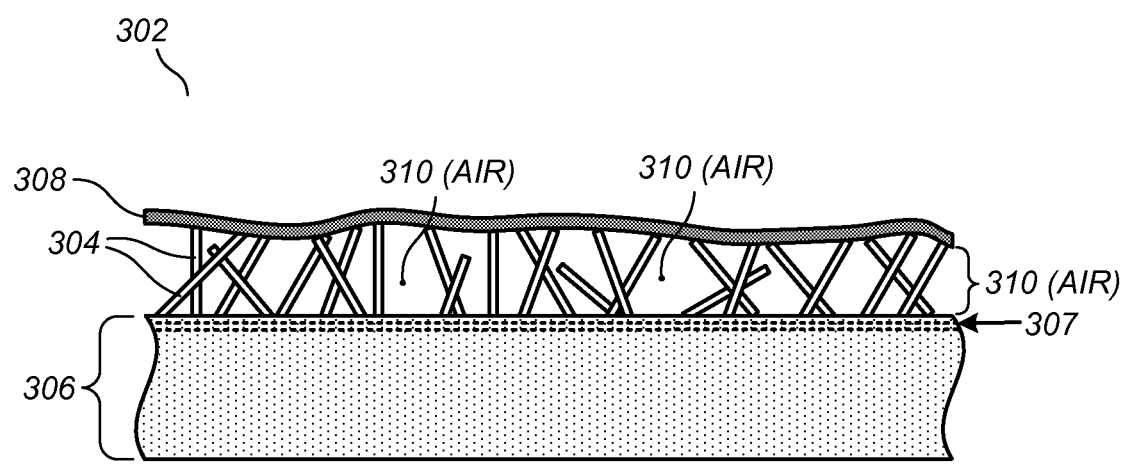
FIG. 3 illustrates a cross-sectional view of a PV nanowire-based solar cell according to a preferred embodiment.

FIG. 3 illustrates a cross-sectional view of a PV nanowire-based solar cell 302 according to a preferred embodiment. A population of PV nanowires 304 extends outwardly from a substrate 306, the substrate 306 including a template layer 307 along its surface comprising a short-range atomic order (SRAO) material. Each of the PV nanowires 304 includes a base end adjacent to the substrate 306 and a tip end opposite the base end. The PV nanowires 304 are illustrated in FIG. 3 as cylindrical, but can take on nanoneedle-style shapes similar to those of FIG. 2, supra, or any of a variety of other elongate shapes depending on particular material selections and/or generation methods. The substrate 306 is electrically conductive at least along the template layer 307 such that it can serve as a bottom electrode (root-side electrode) of the solar cell 302. A canopy-style top electrode 308 (tip-side electrode) is disposed across the tip ends of a plurality of the PV nanowires 304, and an air layer 310 laterally surrounds the PV nanowires 304 between the substrate 306 and the top electrode 308. The plurality of PV nanowires 304 that are in contact with the top electrode 308 serve as supports or "tent poles" for the top electrode 308, maintaining it in separation from the substrate 304 such that only the air layer 310 is otherwise present therebetween. This process can be achieved, for instance, when the density of the plurality of PV nanowires is made high enough so that the overall surface on which the top electrode 308 is formed exhibits strong "geometrical" rather than chemical hydrophobic characteristics. Disadvantages that would otherwise be brought about by the presence of an insulator filler material between the top and bottom electrodes (e.g., unwanted photon absorption, electrical shorts, hot spots caused by the degraded insulating material) are avoided. For the particular preferred embodiment of FIG. 3, the air layer 310 comprises air. In other preferred embodiments, the air layer 310 can comprise an inert gas, and/or can be a full or partial vacuum. Prior to the formation of the top electrode 308, a thin passivation layer can be applied on the surface of the plurality of PV nanowires to chemically and physically protect the PV nanowires and stabilize the surface of the PV nanowires to reduce the density of unfavorable surface states. Such thin passivation layer can be made by a technique such as atomic layer deposition that relies upon self-limiting surface chemical reaction of precursors containing desired chemical elements such that the voids among the PV nanowires will not be filled. Such passivation of the PV nanowires is also advantageous for all other preferred embodiments described hereinbelow subsequent to the PV nanowire growth step(s).

In one preferred embodiment, the top electrode 308 (tip-side electrode) comprises a transparent electrical conductor layer characterized by both substantial electrical conductivity and substantial optical transparency at the relevant solar wavelengths, such that incident photons can pass therethrough to the PV nanowires 304 while electrical connectivity is also being provided. In such preferred embodiment, the top electrode 308 (tip-side electrode) corresponds to the radiation-receiving side of the solar cell, while the substrate 306 corresponds to the non-radiation-receiving side of the solar cell. In another preferred embodiment, the top electrode 308 (tip-side electrode) comprises a generally non-transparent electrical conductor layer, such as a relatively thick layer of metal (e.g., greater than 1000 nm thick), while the substrate 306 including template layer 307 are generally transparent to allow passage of incident photons through to the PV nanowires 304. In the latter preferred embodiment, the substrate 306 including template layer 307, which serves as the bottom or root-side electrode of the device, is thereby operable as the radiation-receiving side of the solar cell, while the top electrode 308 (tip-side electrode) corresponds to the non-radiation-receiving side of the solar cell and would be facing downward, for example, in a typical rooftop installation.

For preferred embodiments in which the top electrode 308 (tip-side electrode) comprises a transparent electrode layer, the transparent electrode layer can comprise, for example, a very thin (e.g., well under 1000 nm thick and usually only on the order of a few nm thick) layer of metal such as Au, Pt, Rh, Ag, Cu, Fe, or Ni. Alternatively or in conjunction therewith, the transparent electrode layer can comprise semiconducting oxides such as $SnO_2$, $In_2O_3$, and CdO, and/or their alloys such as ITO (indium-tin-oxide), doped $In_2O_3$ with Sn or Sb, and doped $SnO_2$ with F or Cl. In other preferred embodiments, the top electrode 308 can comprise layered formations of metals and alloyed semiconducting oxides that have been shown to exhibit good combinations of optical transparency and electrical conductivity. By way of example, the top electrode 308 (tip-side electrode) can comprise a top layer of 30-nm thick ITO, a middle layer of Ag or Cu between 5 nm-35 nm thick, and a bottom layer of 30-nm thick ITO, having optical and electrical properties that are discussed in {9}, supra.

Figure 4:
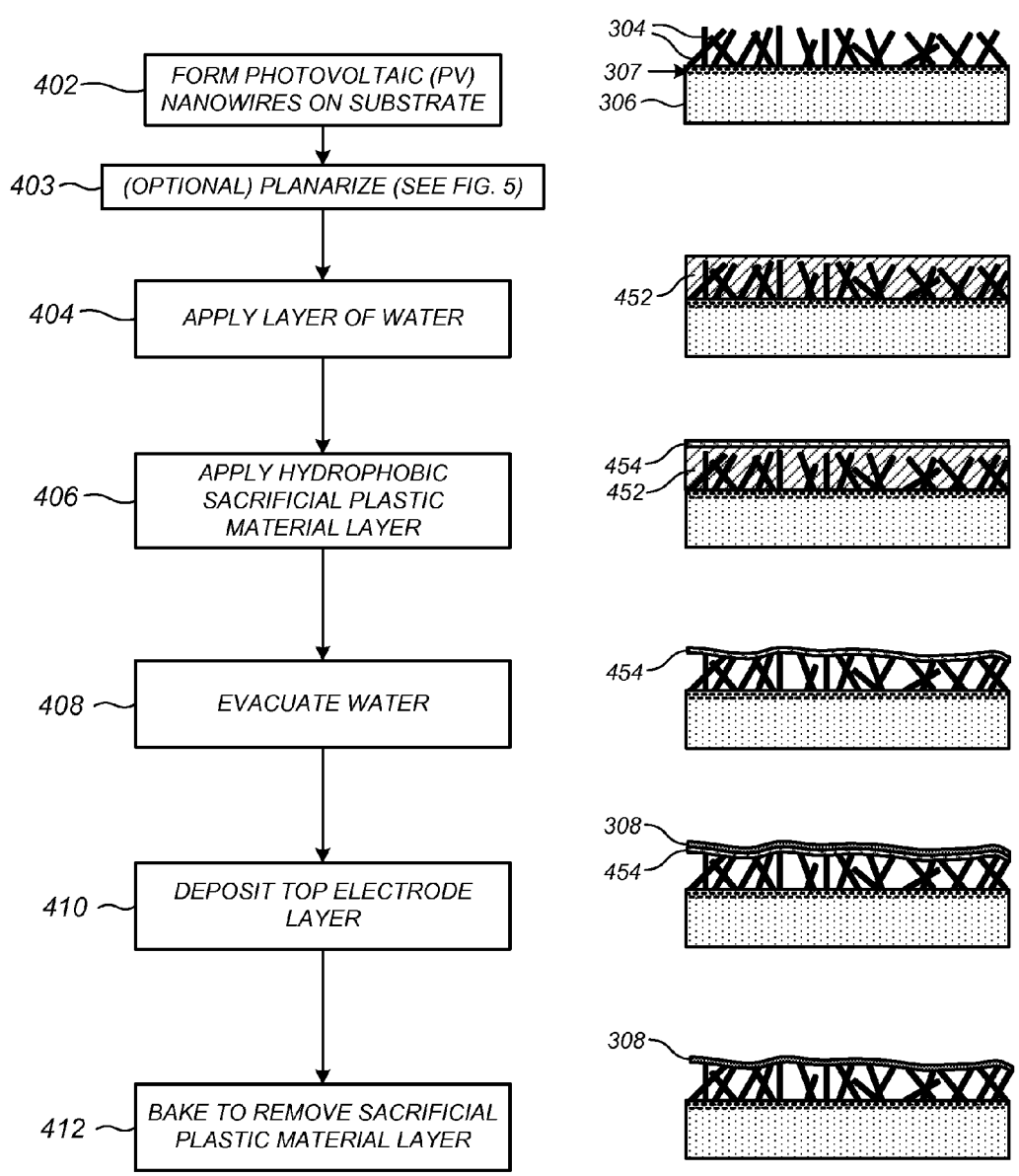
FIG. 4 illustrates fabricating a PV nanowire-based solar cell according to a preferred embodiment.

FIG. 4 illustrates fabricating a PV nanowire-based solar cell according to a preferred embodiment. At step 402, using processes such as those described in {1}-{3}, supra, the PV nanowires 304 are formed upon the substrate 306, the substrate 306 having been processed to contain a short-range atomic order (SRAO) template layer 307. Depending on the degree of PV nanowire alignment achieved as well as variations in PV nanowire length, which might result in excessive variation in the height of the PV nanowire tips above the surface of the substrate 306, it may be elected at step 403 to planarize the PV nanowires 304 such that their tips rise to a more uniform height above the surface of substrate 306. One particularly advantageous method of PV nanowire planarization is described infra with respect to FIG. 5. Advantageously, however, in view of steps 404-414 below, absolute uniformity in the heights of the nanowire tips is not required, and so planarization step 403 might not be required.

At step 404, a layer of water 452 (or other substantially nonviscous liquid having similar properties) is applied that laterally surrounds the PV nanowires 304 and rises above the height of most or all of the PV nanowires 304 to substantially or totally submerge the PV nanowires 304. At step 406, a layer of hydrophobic sacrificial plastic material 454 in a pre-cured (that is, uncured or not yet cured) liquid form is sprayed across the top surface of the water layer 452. In one preferred embodiment, the sprayed liquid is a lacquer film formed from appropriate resins or plastics that can be dissolved in volatile solvents. Such resins or plastics may include cellulose esters such as nitrocellulose or cellulose acetate, polystyrene, or isobutyl methacrylate, and may be dissolved in a volatile solvent or mixture of solvents, such as toluene and acetone, to make the material free-flowing. Upon at least partial curing of the plastic material layer 454, the water layer 452 is evacuated at step 408, such as by gravity flow, vacuum pumping, induced evaporation, and the like. In a manner analogous to the way an enormous tarp might settle across a forest of trees, or the way a cloth sheet might settle upon a grass surface, the plastic material layer then settles across the population of PV nanowires 304. At step 410, the top electrode 308 (tip-side electrode) comprising a transparent electrical conductor layer is then formed atop the cured plastic material layer 454, likewise taking on a conformal, canopy-like shape. Finally, at step 412, the sacrificial plastic material 454 is removed in a baking step (or similar sublimation-inducing step), such that the top electrode 308 (tip side electrode) then settles across the tips of the PV nanowires 304 in a canopy-like fashion.

With further regard to step 404, an optional surfactant or wetting agent may be used to pre-coat the PV nanowires 304 to reduce surface tension prior to application of the water layer 452, thereby preventing discontinuities in the surface of the water layer 452 and/or subsurface bubbles that could cause various irregularities. In some cases, a certain degree of air bubbling in the water layer 452 could be tolerable depending on the ultimate quality of the sacrificial plastic layer 454 sprayed thereupon in pre-cured liquid form.

It is to be appreciated that the use of water in step 404, followed by the use of a hydrophobic pre-cured liquid in step 406, are presented by way of example and not by way of limitation. Another suitable material "X" that can "flood" the spaces between the PV nanowires 304 to result in a generally level surface above their tips, or that can otherwise be formed among the spaces between the PV nanowires 304 to result in a generally level surface above their tips, can be used instead of water, provided only that such material "X" can be removed subsequent to the curing of an "X-phobic" curable material that has been sprayed (or otherwise deposited) thereover. By way of example, in one alternative preferred embodiment, instead of a water layer there is formed around the PV nanowires 304 a layer of solid $CO_2$ ("dry ice"), after which a solid $CO_2$-phobic, curable material is deposited above the solid $CO_2$ layer and cured, after which the solid $CO_2$ can be readily sublimated away.

With further regard to step 406, the lacquer film applied at step 406 may be prepared in a manner similar to a one discussed in GB698404, entitled "Improvements in or Relating to the Formation of Films on Granular Fluorescent Screens," which was published on Oct. 14, 1953, and/or GB1086374, entitled "Aluminizing Process in the Manufacture of Cathode Ray Tube Phosphor Screens," which was published on Oct. 11, 1964, each of which is incorporated by reference herein. In alternative preferred embodiments, other hydrophobic (or "X"-phobic) liquids that can be dispersed upon the water layer (or other material "X" layer), cured into solid form, and then sublimated, whether now known or hereinafter developed, are within the scope of the present teachings.

With regard to step 410, any of a variety of different processes for depositing the transparent electrical conductor layer to form the top electrode layer 308 can be used without departing from the scope of the preferred embodiments. Examples include chemical methods, such as hydrolysis of chlorides and pyrolysis of metalorganic compounds, and physical methods, such as reactive evaporation and sputtering in an oxygen environment. For alternative preferred embodiments that include a metal wire mesh layer above the top electrode layer 308 (discussed supra with respect to FIG. 3), the overlying metal wire mesh layer can be formed immediately after formation of the top electrode layer 308. For alternative preferred embodiments that include a metal wire mesh layer below the top electrode layer 308 (discussed supra with respect to FIG. 3), the underlying metal wire mesh layer can be formed immediately before formation of the top electrode layer 308 atop the cured sacrificial plastic material layer 454.

Figure 5:
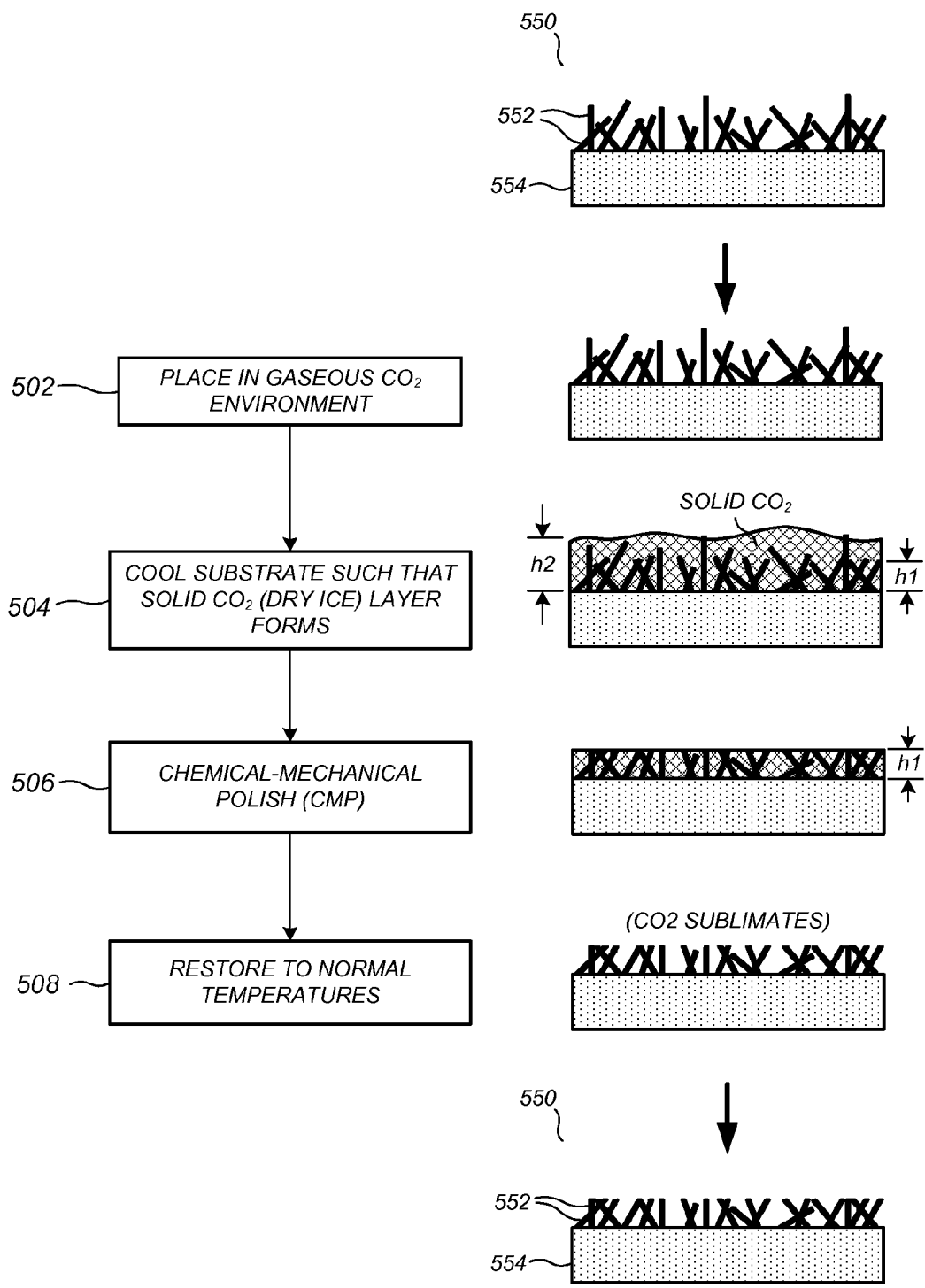
FIG. 5 illustrates planarizing nanowires according to a preferred embodiment.

FIG. 5 illustrates planarizing an array of nanowires according to a preferred embodiment. It is to be appreciated that the method of FIG. 5 can be applied in a wide variety of processes in which planarization across the tips of a population of nanowires is desired, including applications other than PV nanowire applications. Examples of such other applications include, but are not limited to, nanowire-based photoemission devices, nanowire-based chemical sensors, nanowire-based modulators, and nanowire-based thermoelectric devices. The preferred embodiment of FIG. 5 is particularly advantageous when the substrate material comprises one or more layers of stainless steel, chromium, or other highly thermally conductive material, although the scope of the preferred embodiments is not so limited.

Illustrated in FIG. 5 is a device 550 comprising an array of nanowires 552 disposed on an arbitrary substrate 554, the nanowires 552 having different lengths and/or orientations such that their tips are at different heights above the surface of the substrate 554. At step 502, the device 550 is placed in a chamber containing carbon dioxide ($CO_2$) gas. At step 504, the substrate 554 is cooled by an amount sufficient to cause the gaseous $CO_2$ to become deposited in solid form thereon, thereby occupying the lateral spaces between the nanowires 552, the solid $CO_2$ having a surface height h2 greater than a desired planarized height h1 of the nanowires 552. At step 506, the nanowires 552 are planarized in a chemical-mechanical polishing (CMP) process. When the device is restored to normal temperatures (step 508), the solid CO2 sublimates to expose the planarized nanowires 552, thereby completing the process. Advantageously, the solid $CO_2$ serves to laterally stabilize the nanowires 552 during the CMP process. Advantageously, because the triple point of $CO_2$ is well above 1 atmosphere pressure, the process of FIG. 5 can take place at normal room pressures, thereby further promoting low cost, high volume fabrication.

Figure 6:
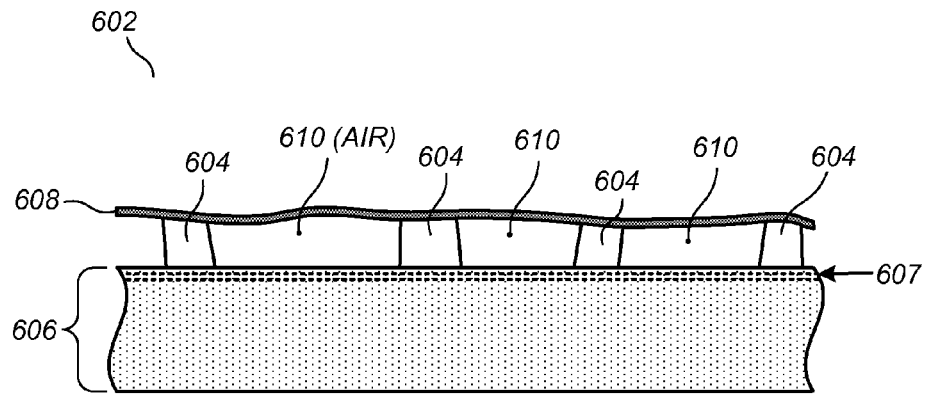
FIG. 6 illustrates a cross-sectional view of a PV nanowire-based solar cell according to a preferred embodiment.

FIG. 6 illustrates a cross-sectional view of a PV nanowire-based solar cell 602 according to a preferred embodiment, comprising a population of PV nanowires 604 disposed on a substrate 606 that includes a short-range atomic order (SRAO) template layer 607. The solar cell 602 further comprises a canopy-style top electrode 608 (tip-side electrode), and the substrate 606 forms a bottom electrode (root-side electrode) at least by virtue of p- or n-type doping of the template layer 607. According to one preferred embodiment, the PV nanowires 604 each have cross-sectional aspect ratios between about 0.5-2.0, such that their surface area-to-volume ratio is relatively low as compared to the nanowires described in {1}-{3}, supra. As used herein, a cross-sectional aspect ratio of a nanowire is defined as a ratio of the length of the nanowire (root to tip) to a root cross-sectional dimension of the nanowire, where the root cross-sectional dimension of the nanowire is the diameter of the nanowire at the root (for cylindrical nanowires), or an analogous root dimension (for example, an average lateral edge-to-edge distance at the root along a line passing through the centroid) for non-cylindrical nanowires. In one preferred embodiment, the nanowires have root cross-sectional dimensions in the range of 0.750-1.50 µm. According to another preferred embodiment, which is particularly advantageous when the PV nanowires 604 are InP nanowires, the PV nanowires 604 each have cross-sectional aspect ratios between about 2.0-5.0. Fabrication of the wide and stubby PV nanowires 604 can proceed in a manner similar to the processes of {1}-{3}, supra, except that the short-range atomic order (SRAO) template layer 607 is fabricated in a manner that ensures SRAO islands sufficient in area to laterally encompass the roots of the larger PV nanowires.

Generally speaking, the PV nanowires 604 are comparatively wide and stubby relative to the nanowires of {1}-{3}, supra. However, the wide and stubby character of the PV nanowires 604 does not fundamentally affect their photovoltaic properties, which are founded upon their crystalline structure and the heterogeneous/homogenous variations induced during their growth. At the same time, the efficiency of the PV nanowires 604 can be enhanced by virtue of their wide and stubby character, because it provides for a lower surface area-to-volume ratio. It has been found that electron-hole recombination losses are reduced in PV nanowires having lower surface area-to-volume ratios. Optionally, the surfaces of the PV nanowires are passivated according to one or more of the method described further infra. For example, different band-gap materials can be deposited conformally thereon through methods such as MOCVD and then subsequently oxidized.

Figure 7:
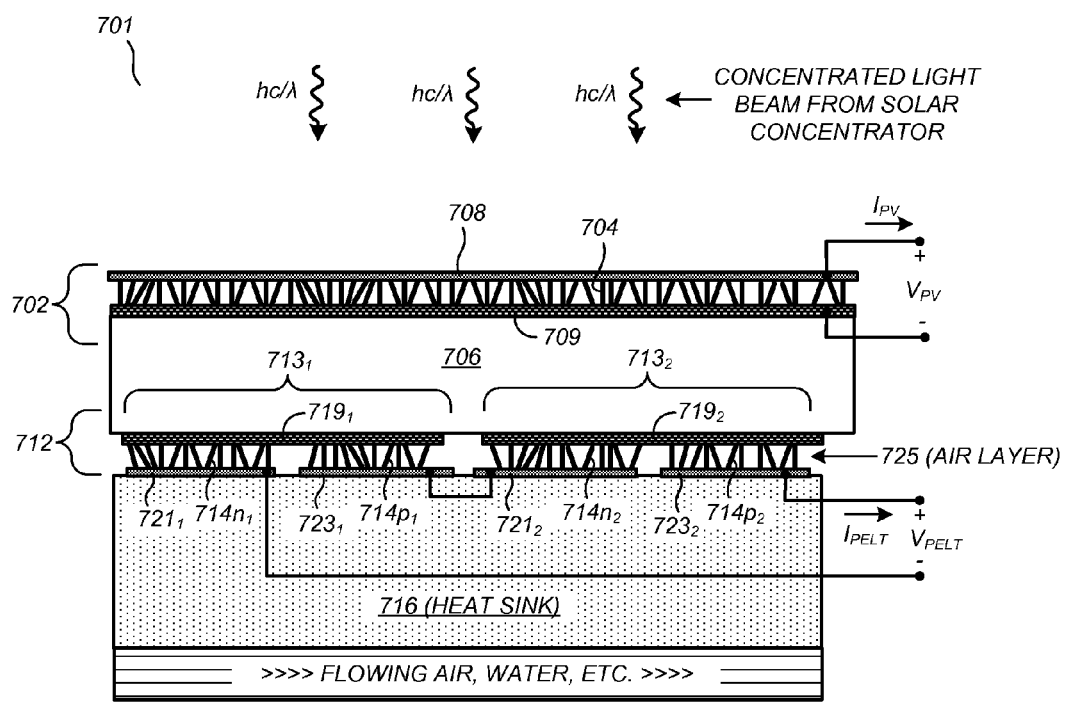
FIG. 7 illustrates a cross-sectional view of a combined photovoltaic and thermoelectric solar energy conversion device according to a preferred embodiment.

FIG. 7 illustrates a cross-sectional view of a solar-electric conversion device 701 according to a preferred embodiment. On a first side (radiation-receiving side) of a substrate 706 is a PV nanowire-based solar cell 702, which can be similar to one or more PV nanowire-based solar cells described supra in the instant patent specification. The substrate 706 is preferably non-electrically conductive and is preferably a good thermal conductor. The substrate 706 is processed to include a first short-range atomic order (SRAO) template layer 709, which is n-doped or p-doped to serve as the bottom electrical node (root-side electrode) of the PV nanowire-based solar cell 702, as well as serving as a surface upon which to grown (or otherwise form) PV nanowires 704. A top electrical node 708 (tip-side electrode) is disposed atop the PV nanowires 704. The solar cell 702, which is shown as providing a first electrical output voltage $V_{PV}$ at a first electrical output current $I_{PV}$, can alternatively comprise a conventional bulk silicon wafer-based solar cell, or another type of photovoltaic solar cell.

Solar-electric conversion device 701 further comprises, on an opposite side (non-radiation-receiving side) of the substrate 704, a nanowire thermoelectric generator (NTEG) device 712. For simplicity of presentation, the NTEG device 712 is illustrated as only having N=2 discrete thermoelectric cells 713, connected in electrical series, but in general contains a larger number N>2 of discrete thermoelectric cells coupled in series. The NTEG device 712 comprises SRAO template layer sections $719_i$ (i=1, 2), which are electrically insulated from each other along the underside of the substrate 706. The PNT device 712 further comprises n-doped nanowires $714n_i$ (i=1, 2) and p-doped nanowires $714p_i$ (i=1, 2) extending outwardly from their respective SRAO template layer sections $719_i$ (i=1, 2). The nanowires $714n_i$ and $714p_i$ are formed from semiconductor thermoelectric materials, now known or hereinafter developed, that can be grown (or otherwise generated) in nanowire form upon an SRAO template layer (or other suitable substrate). Bismuth telluride is an example of a semiconductor thermoelectric material. The nanowires $714n_i$ and $714p_i$ separate the "hot" (upper) side of the NTEG device 712 from the "cold" (lower) side of the NTEG device 712.

Each discrete thermoelectric cell 713, comprises one section of n-doped nanowires $714n_i$ and one section of p-doped nanowires $714p_i$, the sections being connected electrically in series and thermally in parallel. The different n-type and p-type nanowire regions can be grown (or otherwise formed) in separate steps, prior to the formation of electrical nodes $721_i$ (negative) and $723_i$ (positive) of the thermoelectric cells $713_i$. The electrical nodes $721_i/723_i$ can be formed together in a manner similar to the formation of the "top" electrode 308 described supra with respect to FIG. 4, such that an air layer 725 laterally encompasses the nanowires $714n_i$ and $714p_i$. The electrical separation and selected interconnections of the respective electrical nodes can be readily achieved using appropriate masking processes in association with the depositing of the metal or a transparent ohmic-metallic material at step 410 of FIG. 4, supra. The NTEG device 712 provides electrical output power that increases as a temperature differential ΔT increases between the hot and cold thermal nodes. The NTEG device 712 provides a second electrical output voltage $V_{PELT}$ at a second electrical output current $I_{PELT}$.

Advantageously, the solar-electric conversion device 701 usefully captures at least some of the solar energy that the solar cell 702 would fail to usefully capture if it were operating by itself, in particular, the thermal energy resulting from various photo absorption processes associated with mechanisms that do not produce electrical currents that can be extracted by an external circuit, or other dissipative losses in the solar cell 702. Synergistically, due to the insulative effect of the air layer 725 contained laterally around the Peltier nanowires $714n_i$ and $714p_i$, the temperature differential ΔT for the NTEG device 712 is maintained at a higher level than if non-nanowire-based thermoelectric material layers were used, thereby resulting in a higher thermoelectric power conversion efficiency. Preferably, a heat sink device 716 is thermally coupled between the cold thermal node of NTEG device 712 and a mass heat receptor, such as air (e.g., using cooling fins), a flowing stream of water, or the like. Advantageously, the combination solar cell 702/PNT device 712 is robust against high surface temperatures, making the device highly amenable to the use of a solar concentrator (not shown) according to a preferred embodiment, for concentrating larger amount of solar energy onto a smaller device surface area. Using a solar concentrator (not shown) provides for increased overall power capacity at a lesser cost than side-by-side replication of the combination solar cell 702/NTEG device 712.

Advantageously, devices such as the PV nanowire-based solar cell 302 and PV nanowire-based solar cell 602 can be fabricated on a large scale basis and can be provided in a variety of different physical formats, ranging from conventional discrete rooftop panels (e.g., 1600 cm×900 cm in size and outputting about 40 volts), to newer roll-based rooftop applications, to various building integrated photovoltaic (BIPV) applications (see FIG. 7, infra). Because of the wide flexibility provided by virtue of the above-described fabrication processes, the described PV nanowire-based solar cells are amenable to a number of different cell aggregation methods and failsafe mechanisms already developed for conventional crystalline wafer-based solar panels. Thus, for example, by appropriate semiconductor fabrication processes during generation of the bottom substrate and again during deposition of the top electrode supra, a large array of electrically isolated individual 10 cm×10 cm PV nanowire-based solar cells can be provided adjacently to each other on a common sheet of support material, and placed in electrical series with each other to form a 1600 cm×900 cm panel. By the same token, bypass diodes can be readily integrated into that structure across each individual cell or groups of cells (see, e.g., U.S. Pat. No. 5,616,185 and U.S. Pat. No. 6,020,555, each of which is incorporated by reference herein) to prevent catastrophic cell failure in the event of localized shadowing. Advantageously, in the event of an accidental short of a particular cell due to "collapse" of the canopy structure, an intrinsic bypass functionality is automatically provided because the nodes of that cell are already shorted together.

Figure 8:
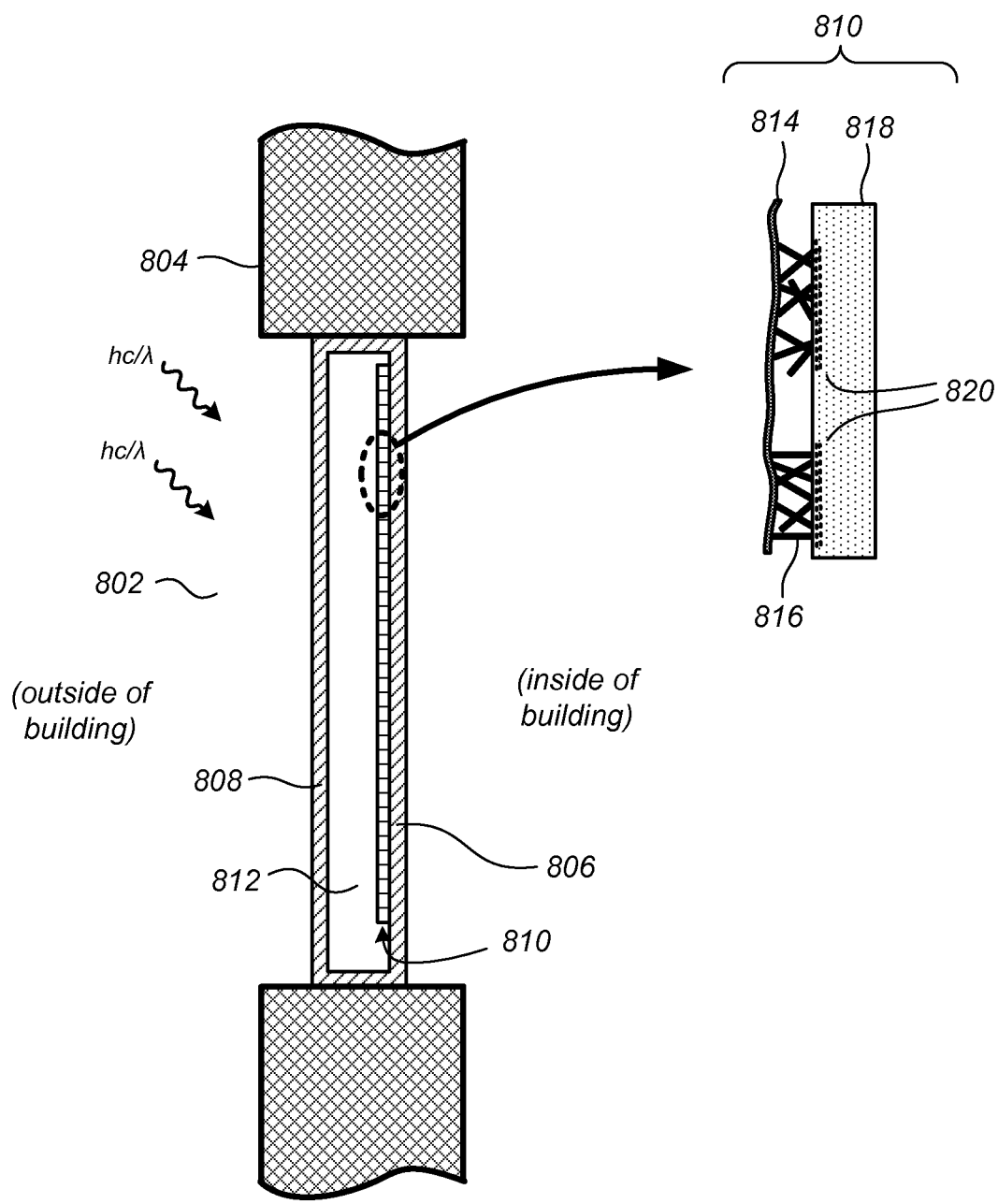
FIG. 8 illustrates a cross-sectional view of a sealed insulated glass product for building integrated photovoltaic (BIPV) applications according to a preferred embodiment.

FIG. 8 illustrates a cross-sectional view of a sealed insulated glass product 802 according to a preferred embodiment as installed in a wall 804 of a building. The sealed insulated glass product 802 comprises an inner glass panel 806, an outer glass panel 808, and a PV nanowire-based solar cell 810 disposed in an air gap (or vacuum gap) 812 between the inner and outer glass panels 806 and 808. The PV nanowire-based solar cell 810 can be generally similar to the preferred embodiments of FIG. 3 and/or FIG. 6, supra, including generally a top electrode layer 814 (tip-side electrode layer), a layer of PV nanowires 816, and a bottom electrode layer 818 (root-side electrode layer). The top electrode layer 814 (tip-side electrode layer) and bottom electrode layer 818 (root-side electrode layer) preferably exhibit a high, predetermined degree (for example, 80%-100%) of optical transparency. The bottom electrode layer 818 (root-side electrode layer) comprises a population of short-range atomic order (SRAO) islands 820 formed along the top surface thereof, the roots of one or more PV nanowires 816 being established at each SRAO island 820. Power leads (not shown) between the PV nanowire-based solar cell 810 and one or more external loads can be provided as needed using methods known in the art.

According to a preferred embodiment, the size, spacing, and pattern of the SRAO islands 820 is preselected and controlled during fabrication such that a predetermined spatial density of PV nanowires 816 is provided for the solar cell 810. The pattern of SRAO islands 820 can be regular or random, depending on the particular desired distribution of the islands, the fabrication techniques used, and so forth. The average spatial density of SRAO islands 820 can be the same across the entire sealed insulated glass product 802, or can be locally varying, whereby the PV nanowire density can likewise be the same across the entire sealed insulated glass product 802, or can be locally varying. Advantageously, the spatial densities of the PV nanowires 816 can be varied, either spatially across an individual sealed insulated glass product 802, or across different versions sealed insulated glass product 802, to exhibit different percentages of light transmission therethrough, as well as correspondingly different amounts of power conversion efficiency. Preferably, the spatial densities of the PV nanowires 816 can be varied to provide light transmission percentages in the range of 20%-80%.

Advantageously, according to a preferred embodiment, there can be provided a wide array of visually pleasing sealed insulated glass products 802 (which can alternatively be termed "solar windows" or "power windows") having different amounts of transparency and power conversion efficiency for serving different aesthetic and functional purposes. Customers, building designers, etc. can choose solar windows with lower PV nanowire densities for higher amounts of light transmission combined with lower amounts of power conversion in one part of a building, and then choose solar windows with higher PV nanowire densities for lower amounts of light transmission combined with higher amounts of power conversion for other parts of the building. In addition to the density of the SRAO islands 820, other parameters can be controlled to affect the light transmission/power conversion trade-offs, including the height of the nanowires, and the properties of the top and bottom electrodes.

According to another preferred embodiment, a photovoltaic cell such as one or more of the above-described PV nanowire-based solar cells is protected by an outer "hydrophobic" layer (not shown). The outer "hydrophobic" layer constitutes the outer surface of the photovoltaic cell, and can be formed as a separate transparent material layer atop the top electrode layer 308 (tip-side electrode layer), or can be formed from a separate transparent material sheet and placed atop the photovoltaic cell, or integrally atop another intervening layer. For one preferred embodiment, the "hydrophobic" layer could be made by dry etching glass, patterned or randomly, according to a black silicon process, for forming fine nanometer-sized hairs thereon. Black silicon surface processing can proceed in a manner similar to that described in WO 2009/100023A2, which is incorporated by reference herein, except that a broader range of transparent materials (e.g., glass, quartz, etc.) can be used. In a manner similar to way plant leaves are known to be kept virtually perpetually clean by fine hairs, the fine hairs of the "hydrophobic" layer can similarly protect the overall PV nanowire-based solar cell. The resultant structure from the black silicon process can also serve as a "light-trap", increasing device efficiency and making it less dependent on the incidence angle of the light.

It is to be appreciated that a variety of modifications of the described devices and methods are within the scope of the present teachings. For example, although one or more preferred embodiments are described herein in the context of photovoltaic nanowires having longitudinally varying doping profiles or other longitudinally varying characteristics, in other preferred embodiments there may be included, alternatively or in conjunction therewith, photovoltaic nanowires having axially varying doping profiles (e.g., core-shell p-n junction nanowires) or photovoltaic nanowires having other axially varying characteristics. By way of further example, although PV nanowire-based solar cells including those with selectable nanowire densities were described in FIG. 8 supra in the context of "solar windows" or "power windows," such PV nanowire-based solar cells can alternatively be incorporated into a variety of building-integrated photovoltaic (BIPV) construction applications without departing from the scope of the present teachings. By way of further example, in alternative preferred embodiments, PV nanowire-based solar cells including selectable nanowire densities can also be adapted for use with aesthetically pleasing solar rooftop shingle configurations, see US 2006/0032527A1, which is incorporated by reference herein. By way of even further example, although the sacrificial plastic layer 454 is described supra as being sprayed on in liquid form and then cured into solid form, it would not be outside the scope of the present teachings for a pre-fabricated sheet of sacrificial material having suitable properties (whether now known or hereinafter developed) to be laid over the tips of the nanowires, instead of the spraying and curing process described supra. By way of even further example, placement of a pre-formed sheet of suitable transparent electrical conductor material (whether now known or hereinafter developed) over the tips of the nanowires to form the top electrode, instead of formation of the top electrode upon a sacrificial material followed by the sublimation of that sacrificial material, would likewise not be outside the scope of the present teachings. Aspects of the preferred embodiments described further in relation to FIGS. 9-13 herein may be more thoroughly understood in view of background reference {4}, supra, and U.S. Pat. No. 7,608,530 B2, which is incorporated by reference herein.

Figure 9:
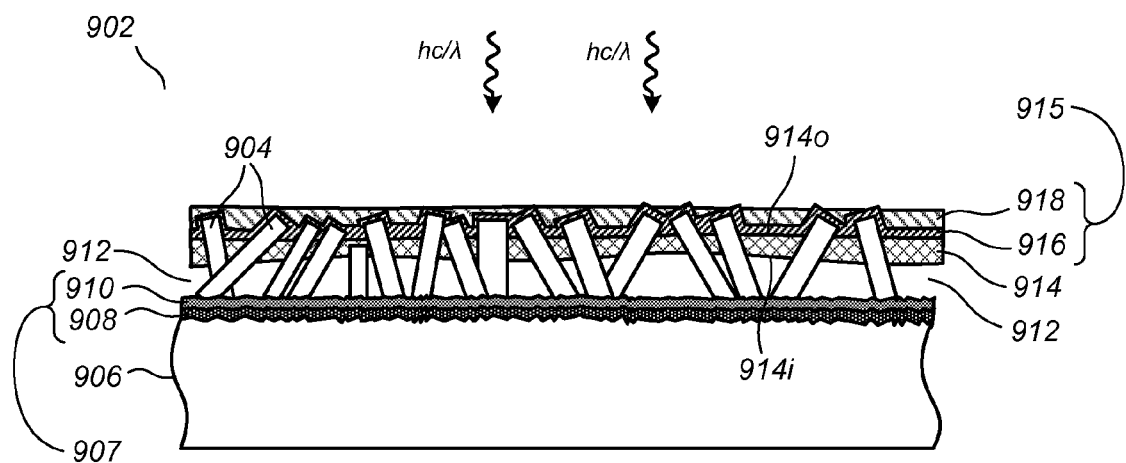
FIG. 9 illustrates a cross-sectional view of a PV nanowire-based solar cell according to a preferred embodiment.

FIG. 9 illustrates a cross-sectional view of a PV nanowire-based solar cell 902 (PV nanowire-based photovoltaic energy conversion device) according to a preferred embodiment including an array of PV nanowires 904. More specifically, for the preferred embodiment of FIG. 9, the array of PV nanowires 904 is sandwiched between a root-side electrode 907 and a tip-side electrode 915. The root-side electrode 907 includes an SRAO layer 910 (for example, n-type amorphous hydrogenated silicon or a-Si:H) and a metallic layer 908 (for example, molybdenum or aluminum). The root-side electrode 907 is disposed upon a substrate 906, which in one preferred embodiment is stainless steel. For cases in which the substrate 906 is electrically conductive, the substrate 906 can be considered as part of the root-side electrode. Tip-side electrode 915 comprises a layer 916 of an optically transparent electrically conductive material, such as an optically transparent electrically conductive semiconductor material including p-type a-Si:H, and a transparent conductive layer (TCL) 918. Although the PV nanowires 904 are shown as having rectangular cross-sections, they can likewise have a nanoneedle character as illustrated in FIG. 2, supra, without departing from the scope of the preferred embodiments. According to a preferred embodiment, a solid layer 114 of transparent insulating filler material is disposed in the space between the root-side electrode 907 and tip-side electrode 915, but it does not fill all of the air space among the PV nanowires 904, whereby there is an air gap layer 912 disposed between an inwardly facing surface 914*i* of the solid filler layer 914 and the root-side electrode 907. The tip ends of the PV nanowires 904 jut outwardly beyond an outwardly facing surface 914*o* of the solid filler layer 914 into physical and electrical contact with the tip-side electrode layer 915.

The air layer 912 represents one of the key differences of the present invention from the prior art of FIG. 2, supra. The design of FIG. 9 can be advantageous in reducing the adverse effects, such as absorption, heating, and darkening over time, that would be brought about by an insulator material that fully extends over the lengths of the PV nanowires, while at the same time providing good lateral stabilization of the PV nanowires and providing a stable platform upon which to fabricate the tip-side electrode layers of the device. Additionally, by the juttable extension of the tip ends of the PV nanowires 904 beyond the outwardly facing surface 914*o* of the solid filler layer 914 and well into the material of the tip-side electrode layer 915, superior electrical contact with the tip-side electrode layer 915 is achieved for promoting superior overall performance.

For one preferred embodiment, the air gap 912 occupies at least twenty-five percent of the vertical space between the solid filler layer 914 and the root-side electrode 907. For another preferred embodiment, the air gap 912 occupies at least fifty percent of the vertical space between the solid filler layer 914 and the root-side electrode 907. For another preferred embodiment, the air gap 912 occupies at least seventy-five percent of the vertical space between the solid filler layer 914 and the root-side electrode 907. Notably, in view of the material characteristics of the solid filler layer 914 (optically transparent, electrically insulating), it is not required that the air gap 912 be provided over one hundred percent of the lateral extent of the root-side electrode 907, because the device would still be substantially operable in the event there is contact between portions of the solid filler layer 914, although the advantages of the air gap would not be enjoyed at those contact locations. Accordingly, some drooping or sagging of the solid filler layer 914 toward the root-side electrode 907 as may occur during device fabrication, including some areas of contact therebetween that are not statistically overwhelming relative to the overall lateral extent of the device, may be acceptable.

For one preferred embodiment, each of the PV nanowires 904 is intrinsically doped along all or substantially all of its length between the root-side electrode 907 and tip-side electrode 915, with a photovoltaic cell being formed by virtue of the p-doped layer 916 at the tip end and the n-doped layer 910 at the root end. For this preferred embodiment the nanowire array 904 acts as the i-region, that is, each PV nanowire 904 is an i-region along its entire length. As used herein, i-region refers to a semiconductor region that is an intrinsically doped semiconductor region, or a semiconductor region that is not intentionally doped, as contrasted with p-region or p-doped region (intentionally p-doped) and n-region or n-doped region (intentionally n-doped). For another preferred embodiment, the tips of the PV nanowires 904 can be doped of a similar type as the corresponding electrode, as shown in FIG. 11. For the preferred embodiment of FIGS. 9-11, the light photons enter the device from the top (tip-side) through the transparent conductive layer (TCL) 918, then through the thin (10 to 20 nm) transparent p-type electrode layer 916, and then to the array of PV nanowires 904. TCL 918 can comprise a transparent conductive oxide, such as ITO (indium tin oxide), or alternatively any of a variety of different materials known to be both conductive and transparent, preferably with more than 80% light transmission. It is to be appreciated that it is within the scope of the preferred embodiments for the described doping configurations to be reversed, for example, for the p-type electrode layer (and p-type nanowire tips) to be at the root side of the device of FIG. 9 and n-type electrode layer (and n-type nanowire tips) to be near the tip side of the device.

Referring now to FIG. 11, in one preferred embodiment, either the PV nanowires are entirely i-region along their whole length, or, if they do contain some doped regions 904p and 904n near their tips, at least 80% of their length is the i-region 904i. Most of the solar radiation photons are preferably absorbed in the i-region 904i of the PV nanowires 904. The electric field in the i-region, as shown in FIG. 11, is very high (in the range of $10^4$ v/cm), so that the generated electron-hole pairs are efficiently separated by drift and collected. This is different from most of the present thin-film photovoltaic solar cells, where the electron-hole pairs are separated and collected via diffusion resulting in lower overall efficiency. Within the scope of the preferred embodiments are a variety of doping scenarios for the PV nanowires 904, and the electrodes 910 and 916. In one example, the PV nanowire 904 is entirely i-region along its whole length, the electrode 916 is p-doped, and the electrode 910 is n-doped, to form a photovoltaic p-i-n junction. In another example, the PV nanowire 904 is entirely i-region along its whole length, the electrode 916 is n-doped, and the electrode 910 is p-doped, to form a photovoltaic n-i-p junction. In another example, the photovoltaic junction is formed entirely by the PV nanowire 904 without the need for involvement from the electrodes, by having the PV nanowire 904 p-doped (or n-doped) near its tip and n-doped (or p-doped) near its roots. In still another example, the photovoltaic junction is formed by having the PV nanowire 904 doped at one end but not the other, with the opposing electrode being doped. Within the scope of the preferred embodiments are a variety of scenarios in which the PV nanowire 904 serves as the p-i, n-i, p-i-n, or n-i-p device with no need respectively of electrodes 910 and 916, and a variety of other scenarios in which the electrodes 910 and 916 are part of the photovoltaic junction operation.

Figure 12:
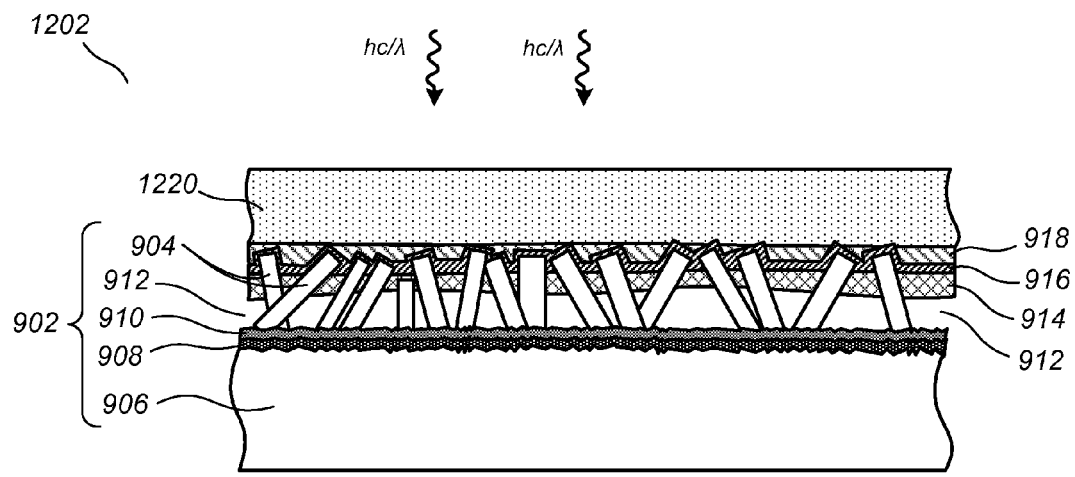
FIG. 12 illustrates a cross-sectional view of a PV nanowire-based solar cell according to a preferred embodiment.

FIG. 12 illustrates a cross-sectional view of a photovoltaic ("PV") nanowire-based solar cell 1202 according to a preferred embodiment, comprising the device of FIG. 9 including a protective glass layer 1220 on top (i.e., on the tip-side of the PV nanowire-based solar cell device).

Figure 10:
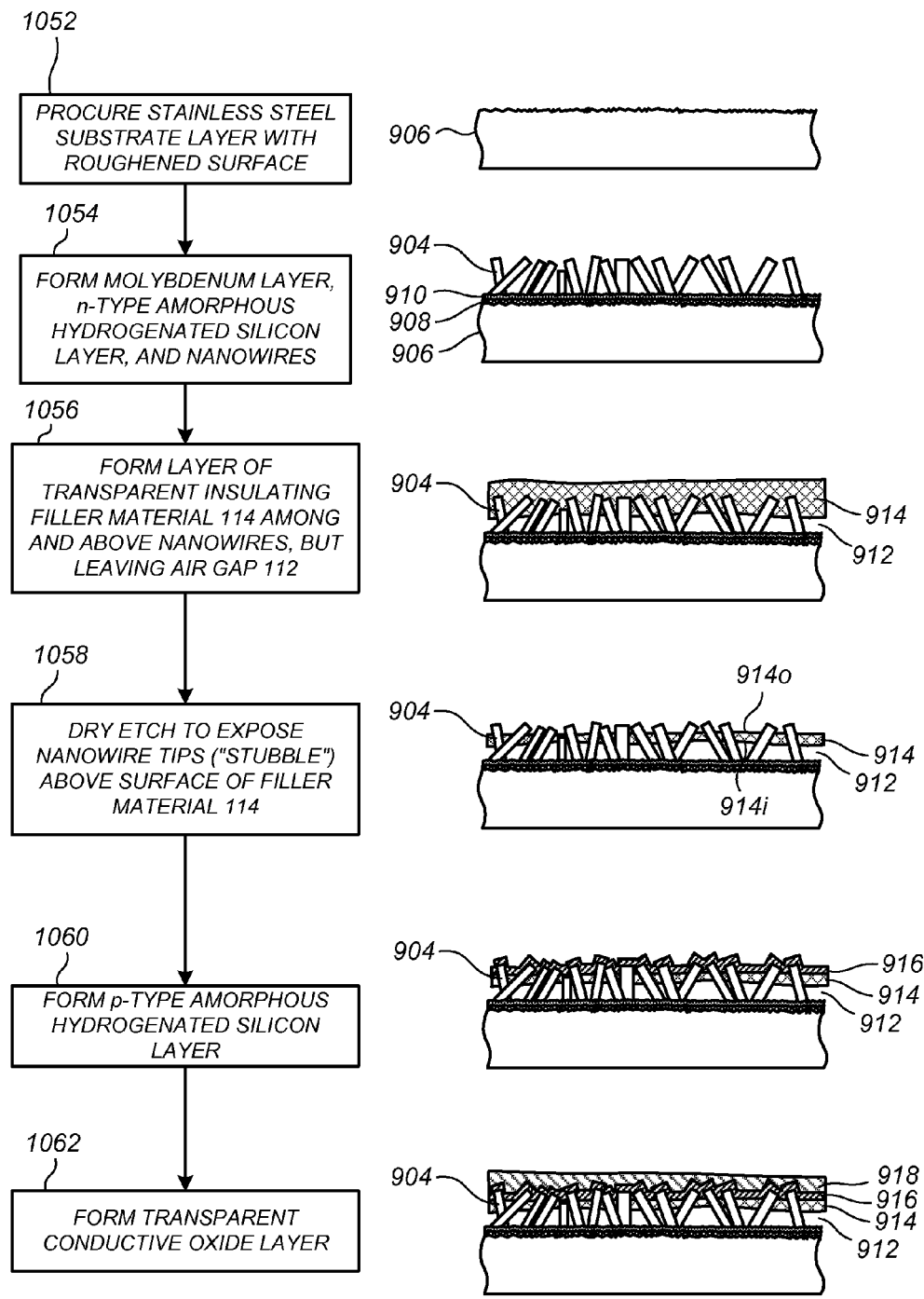
FIG. 10 illustrates fabricating a PV nanowire-based solar cell according to a preferred embodiment.
Figure 11:
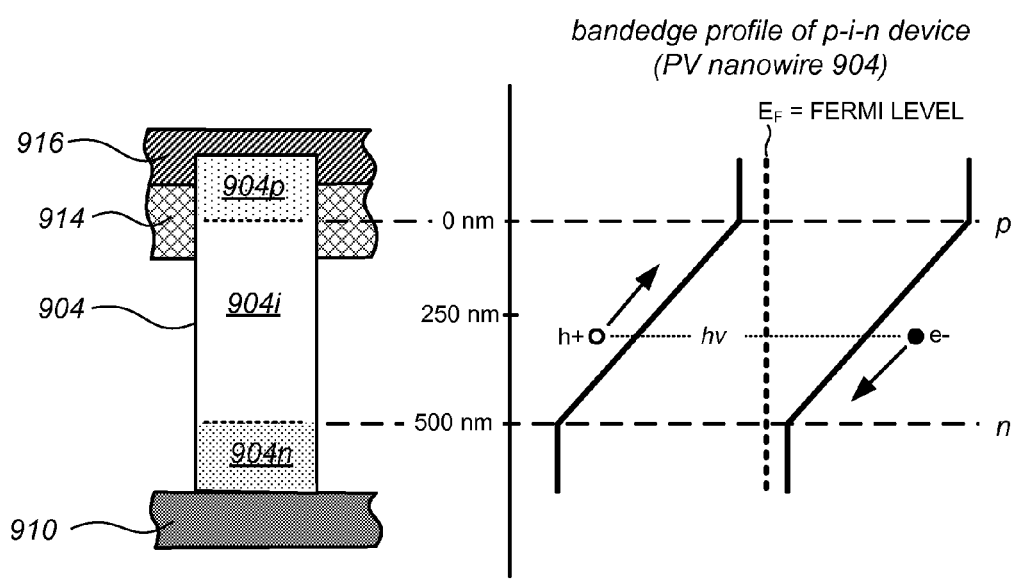
FIG. 11 illustrates a cross-sectional view of a PV nanowire of the apparatus of FIG. 9 and a corresponding band edge profile diagram.

FIG. 10 illustrates fabrication of the device of FIG. 9 according to a preferred embodiment. For this preferred embodiment, a stainless steel substrate 906 is used. At step 1052, the stainless steel surface is textured or roughened, which will increase light trapping by allowing the incident light photons to back-reflect. When the PV nanowires to be grown will have high aspect ratios (greater than 20:1, for example), they will generally be naturally light trapping and so the texturing of the substrate may be less necessary. However, when the PV nanowires to be grown will be short and stubby according to one or more preferred embodiments (less than 20:1, for example), they may be less naturally light-trapping and therefore it will be beneficial to texturize the stainless steel surface.

At step 1054, the stainless steel surface is sputtered or evaporation coated with a layer of metal 908 such as molybdenum or aluminum or other metals, the layer 908 thus also facilitating bottom electrode (root-side electrode) functionality in conjunction with the n-type electrode layer 910. The metal layer 908, on the textured substrate surface, could also reflect back into the nanowire array any transmitted photons. Also at step 1054, the electrode layer 910 of n-type a-Si:H is deposited, for example by PECVD (plasma enhanced chemical vapor deposition). Also at step 1054, the PV nanowires 904 are grown, such as by MOCVD (metal organic chemical vapor deposition) or CVD (chemical vapor deposition) outwardly from the electrode layer 910 with or without the need of catalysts, using for example one or more techniques discussed in U.S. Pat. No. 7,608,530, supra. The nanowires grown by such technique could allow for the design of PV nanowire arrays with better geometry. For one preferred embodiment, the PV nanowires 904 should have a diameter in the range of 100 to 500 nm. Broader ranges, such as 20 to 1000 nm are also usable. One particularly important feature is the cross-sectional aspect ratio of the PV nanowires 904 (ratio of length to root cross-sectional dimension). For better performance, lower aspect ratios are more desirable, preferably in the range of 1:1 to 20:1, which is in contrast to known prior art PV nanowire aspect ratios that are much larger than 20:1.

At steps 1056-1058, the layer 914 of optically transparent, electrically insulating solid filler material is formed that laterally surrounds the PV nanowires 904 along a portion of their lengths, wherein said forming is carried out such that (i) the air gap 912 remains between the root-side electrode and an inwardly facing surface 914i of the solid filler layer 914, and (ii) the tip ends of the PV nanowires 904 are juttably exposed beyond an outwardly facing surface 914o of the solid filler layer 914. At step 1056, the optically transparent, electrically insulating solid filler material is applied, such as by spinning. For one preferred embodiment, the filler material comprises a spin-coating material, such as spin-on glass (SOG) or cyclotene, that is applied to the top of the PV nanowire array and then spun on. However, the spin-coating material is selected, and the spinning process is carried out, such that the air gap 912 remains. This can be achieved as an outgrowth of the selection of materials, the spinning rate, the spinning time, and so forth as could be empirically or analytically determined, and would be achievable by a person skilled in the art in view of the present disclosure without undue experimentation. At step 1058, the solid filler layer 914 is subject to a dry etch, such as with O2 plasma, so that most of the PV nanowires 904 jut outwardly from the outward surface 914o of the solid filler layer 914 and are available to make good physical and electrical contact with the tip-side electrode layer. Since the PV nanowires 904 are less affected by the etching, their tip ends look much like stubble or whiskers sticking out of the solid filler layer 914.

Notably, a variety of different materials for the solid filler layer 914 and methods for achieving the result of steps 1056-1058 are within the scope of the preferred embodiments. For example, the solid filler layer 914 can alternatively comprise one or more of Si oxides, Si nitrides, Al oxide, Al nitride, or other materials that are optically transparent and electrically insulating, and methods of application other than spinning such as spraying and injecting via inkjet could be used. One key difference from the prior art of FIG. 2, supra, is to not substantially fill the depth space between the PV nanowires, thereby leaving the air gap 912. In this way, the filler material will not absorb substantial amounts of the incident photons before reaching the i-region of the PV nanowires. An optically transparent, electrically insulating filler material that is somewhat phobic to the PV nanowires so that it does not "wet" well to the nanowires may be preferred. Advantageously, upon establishment at step 1058, the outwardly facing surface 914o of the solid filler layer 914 is available as a stable platform for the formation of the tip-side electrode layers. As used herein, the term "layer" should not be construed as limiting such item to a single material, but rather a layer recited herein such as the solid filler layer 914, the passivation layer 1456, root-side electrode layer, or tip-side electrode layer can comprise multiple sublayers of different materials.

At step 1060, for this preferred embodiment, a p-type layer 916 of amorphous Si:H is deposited on the outwardly facing surface 914o of the solid filler layer 914 by a PECVD process. Finally, at step 1062, the TCL 918 (transparent conductive layer) is deposited. There are a number of well-known materials that can be used for the TCL 918 that are suitable in photovoltaic cells, such as SnO (tin oxide), indium-tin oxides (ITO), ZnO, etc., as well as non-oxide materials that are substantially conductive and substantially transparent.

In another preferred embodiment as will be discussed further infra, before forming the solid filler layer 914, an atomic layer of Si oxide or Al oxide is deposited onto the nanowires to coat the PV nanowires using atomic layer deposition method. This is for passivating the surfaces of the PV nanowires and increase the overall efficiency.

Presented by way of example, and not by way of limitation, are typical dimensions and materials for the various layers of the PV nanowire-based solar cell 902 of FIG. 9 and FIG. 12. The metal layer 908 will typically be greater than 100 nm thick and comprise a metal/multiple layers of metals and/or metallic alloy including silicides such as Mo, Cr, NiSi, etc. The n-electrode layer 910 will typically be n-type a-Si:H (B doped a-Si-H, etc.) having a thickness greater than 50 nm. The PV nanowires 904, which have the preferred dimensions and aspect ratios described supra, can comprise Group IV, II-VI, or III-V semiconductors and related alloys. For one preferred embodiment, the nanowires 904 will have lengths and diameters of about 10 nm or greater, again so as preferably to keep their aspect ratios low to make their surface area to volume radios low. The p-electrode layer 916 will typically have a thickness greater than 10 nm and may comprise wide bandgap non-single-crystal semiconductors such as p-type a-Si:H, p-type mc-Si:H, p-type SiC, etc. The TCL 918 will typically have a thickness greater than about 500 nm and will preferably comprise a wide bandgap transparent semiconductor (ITO, ZNO, etc.). The PV nanowire-based solar cell 902 will also comprise a mesh-style electrode layer (not shown in FIG. 9) atop the TCL 918, the mesh-style electrode layer being optimally designed to provide electrical connectivity to the various areas of TCL 918, while at the same time not covering too much lateral area so as to allow most of the incident light to pass through to the TCL 918 and the underlying layers.

Figure 13:
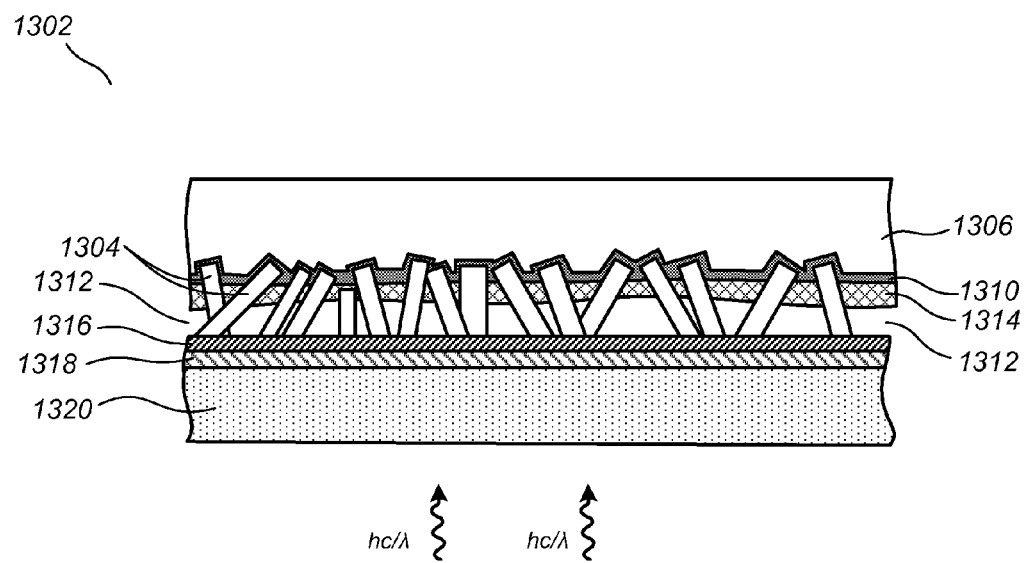
FIG. 13 illustrates a cross-sectional view of a PV nanowire-based solar cell according to a preferred embodiment.

FIG. 13 illustrates a cross-sectional view of a photovoltaic ("PV") nanowire-based solar cell 1302 according to another preferred embodiment including PV nanowires 1304. The structure is very similar to the above structure of FIG. 12, except the light photons enter through a transparent substrate 1320 such as glass, or a thin plate of glass. The doping of the root-side and tip-side electrodes is also reversed. For one preferred embodiment, fabrication of the nanowire-based solar cell 1302 proceeds as follows: a glass substrate 1320 is prepared and cleaned; then TCL 1318 is formed; then p-type Si electrode 1316 is formed; then PV nanowires 1304 are formed; then transparent insulating solid filler layer 1314 is formed in a manner that leaves an air gap layer 1312; then there is a dry etch to cause the tips of the nanowires 1304 to be exposed in a "stubble" like fashion above the etched-down surface of the solid filler layer 1314; then the n-type Si electrode 1310 is formed; then the textured metal conductor layer 1306 is formed.

While in the preferred embodiments supra it is the stainless steel substrate that is roughened or otherwise textured to provide more light trapping, the texturing does not have to be restricted to the substrate. In other preferred embodiments, a smooth substrate can be used, with texturing applied at several other coating places later in the processing under the nanowires. In still other preferred embodiments, both a textured substrate and texturing of the several other layers can be applied.

According to one or more preferred embodiments discussed further herein, the recombination losses in PV nanowire-based solar cells are reduced by forming a passivation layer on the outer surfaces of the PV nanowires according to the methods described herein, the passivation layer being very thin and made of materials highly transparent to relevant solar spectra regions so as to be substantially transparent to incoming photons, the passivation layer comprising a material that electronically terminates dangling bonds at the semiconductor nanowire surface to reduce the areal density of surface states and thereby reduce photo-excited charged carrier recombinations. Preferred embodiments described further herein are advantageously directed to the simultaneous achievement of multiple goals, including (1) reducing the charge recombinations and (2) promoting electrical conduction path along the surface of PV nanowires for either electrons or holes, and paths along the PV nanowire cores for either holes or electrons as in FIG. 16A and FIG. 16B. Other preferred embodiments described further herein provide additional advantages with respect to fabrication practicality and the general ability to provide a wider array of PV nanowire-based solar cells with respect to their type, complexity, and/or orientation.

The description hereinbelow is directed primarily to PV nanowires made of III-V compound semiconductors, for which stable natural oxides are, unlike Si, not available. The description herein is described in the context of arrays of PV nanowires that, like those of several of the preferred embodiments supra, include ensembles of nanowires having generally random orientations with respect to the surface of the substrate to which they are physically attached. However, it is to be appreciated that the general scope of the preferred embodiments is not limited to these particular contexts.

Figure 14:
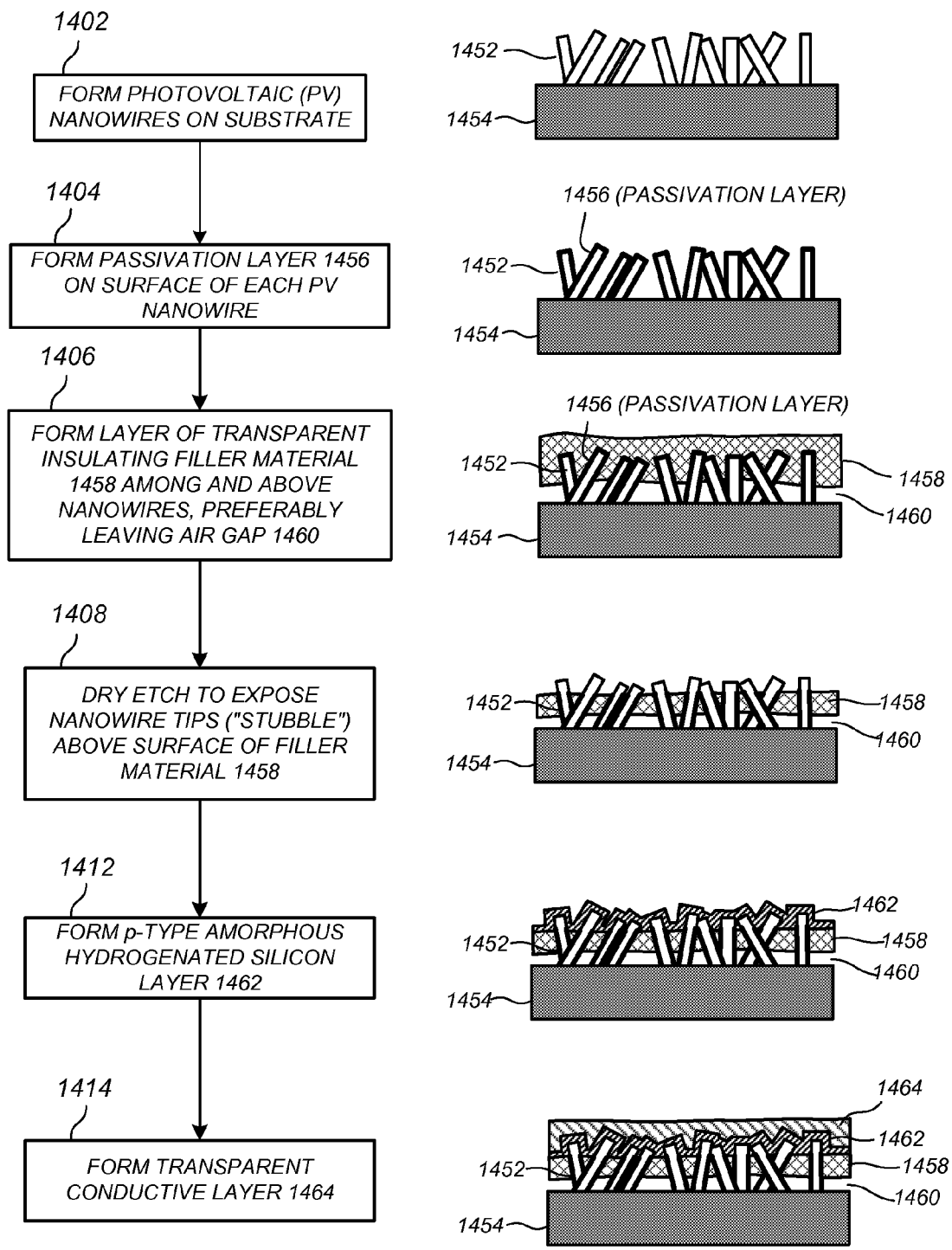
FIG. 14 illustrates fabricating a PV nanowire-based solar cell according to a preferred embodiment.

FIG. 14 illustrates fabrication of a PV nanowire-based solar cell according to a preferred embodiment. At step 1402, PV nanowires 1452 are formed upon a substrate 1454. The substrate 1454 includes a root-side electrode structure (not shown) including an SRAO surface (not shown) similar to those described above from which the PV nanowires 1452 are grown, these elements being omitted from the present description for clarity of disclosure. PV nanowires amenable to passivation methods according to one or more of the preferred embodiments can be formed upon substrates that exhibit long-range atomic order, substrates having SRAO material surfaces, or other suitable substrates.

At step 1404, the PV nanowires 1452 are passivated by forming a passivation layer 1456 (which may itself comprise multiple individual passivation layers) on each individual PV nanowire 1452. The passivation layer 1456 can be formed using methods including, but not limited to, atomic layer deposition. Atomic layer deposition can be particularly advantageous for randomly oriented ensembles of nanowires with high aspect ratio for which conventional chemical vapor deposition may not be sufficiently functional. Atomic layer deposition will provide conformal deposition that uniformly covers complicated geometrical surfaces resulting from ensembles of nanowires randomly oriented. Suitable materials for the passivation layer 1456 include, but are not limited to, aluminum oxide, tin oxide, titanium oxide, silicon oxide and certain nitrides. In one preferred embodiment for which the PV nanowires 1452 are formed from InP material, the passivation process comprises depositing a thin layer of $SiO_2$ on the PV nanowires 1452 by placing the assembly in an atomic layer deposition reactor and introducing two precursors containing silicon and oxygen that react spontaneously even at room temperature. Prior to the deposition of a passivation layer, the surfaces of the PV nanowires 1452 could be chemically pretreated to saturate dangling bonds on the surface. For instance, a process that employs chemicals that contain sulfur using ammonium sulfide was found very effective way to reduce adverse surface effects as described in {10}, supra. However, an ensemble of nanowires is inherently hydrophobic, thus a surface treatment based on solution will not work as uniformly on all nanowires within an ensemble. Instead, it is more preferable to place a small amount of solid sulfur in atomic layer deposition reaction chamber during the deposition of a passivation layer. The sulfur pretreatment process serves to protect, or at least stabilize, the surface of the PV nanowires 1452 against thermal degradation during the deposition of a passivation layer.

Subsequent to the passivation of the PV nanowires 1452 at step 1404, the remainder of the solar cell fabrication process can proceed according to one or more methods described above, including those of FIG. 4 and those of FIG. 10. The remainder of steps of FIG. 14 are similar to the latter steps of the fabrication method of FIG. 10 that results in the device of FIG. 9, although in another preferred embodiment the passivated PV nanowire structure can be processed in a manner similar to the latter steps of the fabrication method of FIG. 4 that results in the device of FIG. 3. At step 1406, a layer of substantially transparent insulating filler material 1458 is applied, preferably in a manner that leaves an air gap 1460. At step 1408, the filler layer 1458 is subject to a dry etch, such as with O2 plasma. Since the PV nanowires 1452 are less affected by the dry etch, the appearance is much like whiskers sticking out of the transparent insulating filler 1458. Advantageously, a significant longitudinal portion of the PV nanowires 1452 are now available to make electrical contact with the top layers, rather than just the top tips of the PV nanowires. In addition to etching back the filler material 1458, the dry etch step 1408 should also serve to etch back the passivation layer 1456 above the surface of the filler material 1458 so to expose the tips and upper sidewalls of the PV nanowires 1452, to facilitate electrical contact with the subsequently applied p-type layer of amorphous Si:H. At step 1412, the p-type layer 1462 of amorphous Si:H is deposited on the filler layer by PECVD process. Advantageously, by virtue of the etch back step 1408, a better ohmic contact is established between each PV nanowire 1452 and the a-Si:H layer 1462, since the a-Si:H layer 1462 now can make substantial contact with the upper side walls of the PV nanowires 1452 rather than just the very tips of the PV nanowires 1452. Finally, at step 1414, a transparent conductive layer 1464 (e.g., comprising tin oxide, indium-tin oxides, zinc oxide, or other substantially conductive and substantially transparent material) is formed above the Si:H layer 1462.

Conventional uses of a passivation layer on a semiconductor surface is rather passive in the sense that electronic states associated with the presence of a surface are inactivated so that they do not contribute to the electrical transport properties of bulk semiconductor underneath the surface. In contrast, within our frame work of passivation of PV nanowires, we explicitly control the electrical transport properties of PV nanowires by tuning the electronic structures established between a passivation layer and a semiconductor surface.

Explicit control of the electronic structures can be established between a passivation layer and a semiconductor surface by controlling, for instance, bandgap of a passivation layer or the density of built-in ionized impurities in a passivation layer, which can be very advantageous for PV nanowires. Unlike a semiconductor surface that exists on a bulk semiconductor that has infinite thickness, the diameter of a nanowire is very small, thus electronic band that deforms at the surface of a nanowire can be interacted inside of a nanowire as in FIG. 15. As a result, photo-generated excess electron and holes can confined either near the center of a nanowire or near the surface of a nanowire as shown in FIG. 16A and FIG. 16B depending on the direction the electronic bands bend at the surface of a nanowire. The band bending at the surface of a nanowire can be intentionally controlled by, for instance, having a passivation layer contain either negatively or positively charged ions.

In our PV structure that employs PV nanowires described hereinabove, all nanowires in an ensemble of nanowires have a built-in electric field parallel to the long axis of nanowires, thus, charged carriers confined near the center of a nanowire can be swept away by drift without getting scattered at the surface of a nanowire while charged carriers confined near the surface of a nanowire will be swept away by drift in quasi-two dimensional channel (i.e., two-dimensional electron or hole gas), which improves overall PV properties.

Figure 17:
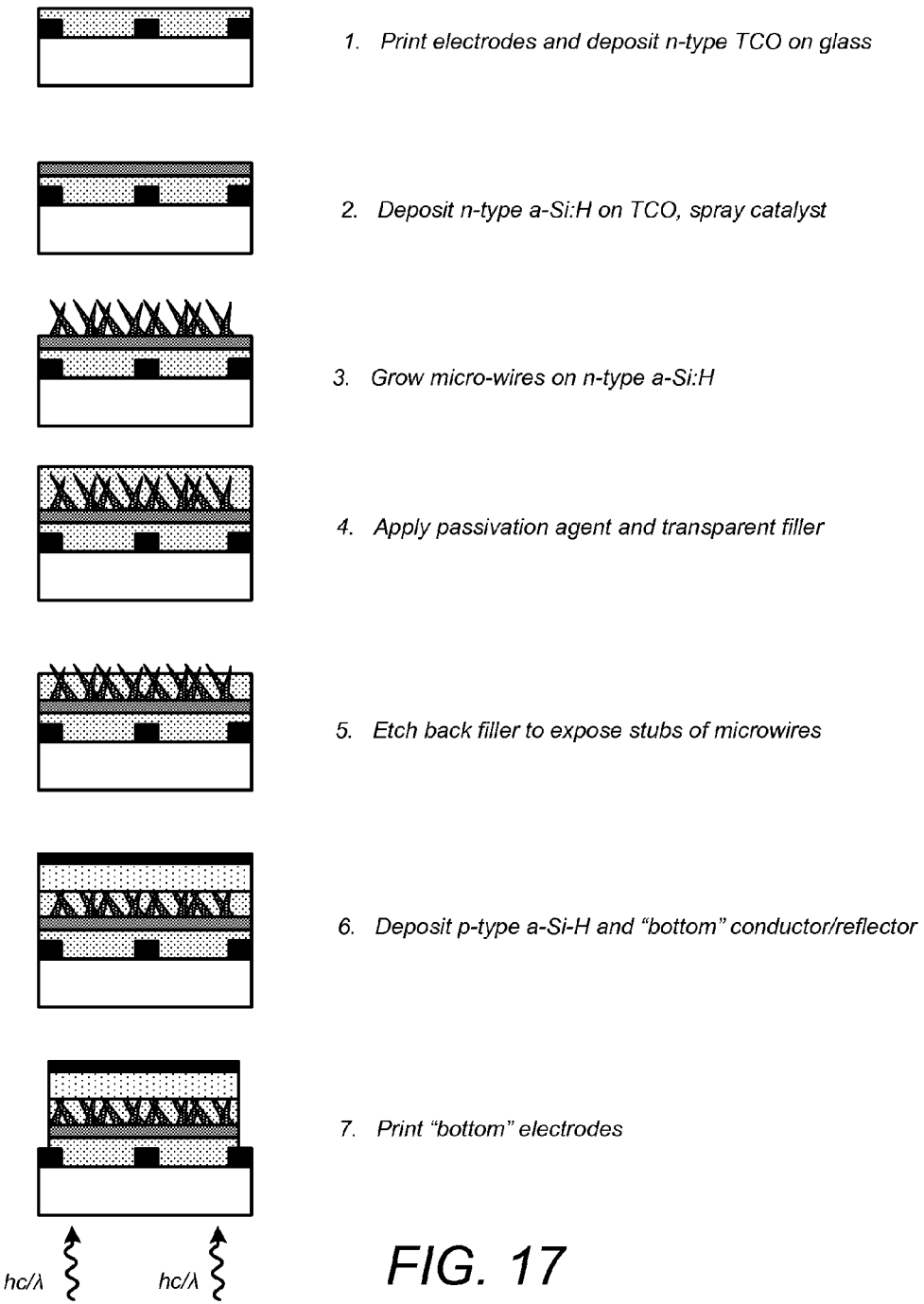
FIG. 17 illustrates fabricating a PV nanowire-based solar cell according to a preferred embodiment.

The term "micro-wires" or "microwires" can be used to refer to the PV nanowires 1452 where their root dimensions approaches the order of hundreds of nanometers. In accordance with another preferred embodiment illustrated in FIG. 17 and FIG. 18, it has been found particularly advantageous for the underlying substrate to be made of glass, with a transparent conductive oxide (TCO) layer formed on the glass and a heavily doped Si:H layer above the TCO layer, the micro-wires being grown on the Si:H layer. There are some advantages in growing the micro-wires on a transparent (such as glass) substrate, versus growing them on metal or non-transparent substrates. These preferred configurations, with our micro-wires grown on glass substrate, are shown in FIG. 17 and FIG. 18.

Although thin-film solar cells have been made on glass and metal substrates, in the case of micro-wires the difference could be large. When a non-transparent substrate is used, we need to know how to optimize the filler layer, how to optimize the dry etch to expose almost all of the micro-wires, how to perhaps further trim the micro-wire stubs so that we have optimal contact yet less blockage of the incident light photons by the non-active portion of the micro-wire stubs, how to optimize the deposition of the a-Si layer to provide a p-type (or n-type) junction, and finally how to optimize the TCO layer so that we have just the right conductivity and optical transmissivity. The part of the layers where the light photons enter are very critical but yet very rough and coating or deposition of these layers could be challenging, which might impact the manufacturing yield.

For a solar cell made on a non-transparent substrate, there will be a need for a protective encapsulation on the light incident side, which consists of a sun-resistant transparent overcoat of polymer (see, for example, reference {8}, supra). This encapsulation layer could further reduce the efficiency of the panel and may yellow with time.

Thus, by using a transparent (such as glass) substrate with our micro-wires, we could avoid or reduce some of these problems. The optimization of filler, a-Si and a conducting layer becomes an easier and less critical job, since we do not need to optimize the light photon transmission. Also, the encapsulation is only needed for the back side, so aging is not an issue. Furthermore, we have a good and smooth contact for the micro-wires to grow on, whether it is a TCO or a TCO plus a light layer (1-20 nm or less) of a-Si, or TCO plus a regular layer (around 20-100 nm) a-Si. Group III-V materials, such as InP and GaAs are very suited to be the micro-wire material.

Stated in an additional way, the use of a transparent substrate, such as glass, can bring about several practical advantages, and furthermore can open up the possibility for a rich variety of more complex photovoltaic devices, over the use of an opaque substrate, for which the incoming solar radiation must be incident upon the tip-electrode surface. By way of example, there can be a substantial relaxation of the methods used to form the tip-electrode structures of the device in terms of their ultimate transparency to incoming solar radiation, since that requirement is no longer critical. Even though intended to result in a substantially transparent tip-electrode surface, steps 1408-1414 of FIG. 14 could possibly be prone to the formation of radiation-absorbing or radiating-reflecting variances, such as a possible "shadowing" effect caused by the upwardly-jutting nanowire tips. Moreover, certain design trade-offs can be tilted in the direction of better performance, such as for the trade-off between better electrical performance of the tip electrode (calling for thicker transparent conductive layer 1464) versus optical transparency of the tip electrode (calling for a thinner transparent conductive layer 1464), which can be tilted toward better electrical performance of the tip electrode. Indeed, for designs in which all of the incident radiation will be entering the root-electrode side of the device, the tip electrode can even be coated with a complete metal layer, rather than just a grid-style electrode.

By way of further example, for designs in which the tip electrode structures can indeed be made substantially transparent, the use of a glass substrate provides a practical method for forming multiple-junction structures in which PV nanowire arrays are stacked on top of each other, each upper PV nanowire array having a higher bandgap than each lower PV nanowire array. The use of a glass substrate provides a relatively simple method for forming such structures, because each layer can be formed on its own glass substrate, and then the layers can simply be mechanically sandwiched together.

As another option, two differently-bandgapped PV nanowire arrays can be grown on opposite sides of a single glass substrate to form a dual-junction structure, the PV nanowires with the wider bandgap being on the incident side (the side facing the sun). This could be simpler than attempting to fabricate a multiple junction device comprising stacked arrays of micro-wires by a single bottom-up growth process.

Referring now again to steps 1404-1406 of FIG. 14, for one preferred embodiment the atomic layer deposition of the passivation layer onto the PV nanowires 1452 can be carried out at a temperature of about 150 degrees C., and the spinning on of SOG can also be carried out at a temperature of about 150 degrees C. In many cases, the solid filler layer 1458 will also serve to promote or reinforce at least some amount of passivation for the PV nanowires 1452.

According to one alternative preferred embodiment, whereas the mechanically stabilizing filler material layer 1458 of FIG. 14 is described above as being a permanent part of the solar nanowire array device, there can instead be used a temporary mechanical stabilization layer that can be removed (e.g., by sublimation) from the ultimately realized structure. As indicated previously, the use of the above-described passivation techniques are not mutually exclusive with the employment of "short and stubby" aspect ratios for the PV nanowires for reducing recombination loss, and therefore in other preferred embodiments the use of the above-described passivation techniques are combined with the employment of "short and stubby" aspect ratios for the PV nanowires for achieving even further reduction in recombination loss. For one preferred embodiment, the PV nanowires can have root diameters in the range of 400 nm-750 nm and aspect ratios (height to width) in the range of 2.0-5.0. For another preferred embodiment discussed further infra, the micro-wires of FIGS. 17-18 can be grown directly on the TCO layer, with or without a catalyst, by omitting step 2 of FIGS. 17-18, or alternatively growing the micro-wires upon only a very thin (e.g., 5 nm) layer of a-Si:H disposed on the TCO layer.

Figure 19:
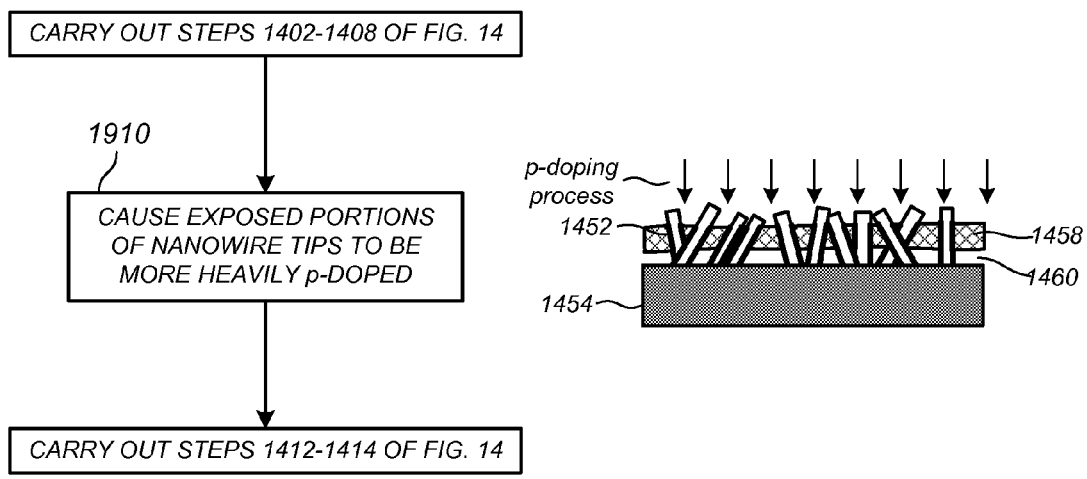
FIG. 19 illustrates fabricating a PV nanowire-based solar cell according to a preferred embodiment.

FIG. 19 illustrates fabrication of a PV nanowire-based solar cell according to a preferred embodiment. Although particularly advantageous where the PV nanowires made of III-V compound semiconductors such as InP, the method is applicable to other types of PV nanowires as well. Referring briefly to FIG. 14, supra, steps 1402-1408 are carried out to the point where the tips of the PV nanowires 1452 jut outwardly beyond an outwardly facing surface of the solid filler layer 1458. However, prior to formation of the tip-side electrode layers, a doping step 1910 is performed (such as by diffusion, ion implantation, or other suitable method) to cause the exposed tips and upper sidewalls of the PV nanowires 1452 to be more heavily p-doped. For preferred embodiments in which the PV nanowires 1452 comprise intrinsic (undoped) semiconductor material as a result of step 1402, then after step 1910 the portions near the exposed tips and upper sidewalls of the PV nanowires 1452 are substantially p-doped. For preferred embodiments in which the PV nanowires 1452 comprise p-doped semiconductor material near their tips as a result of step 1402, then after step 1910 the portions near the exposed tips and upper sidewalls of the PV nanowires 1452 are more heavily p-doped than they were immediately after step 1402. Subsequent to the doping step 1910, the method of FIG. 14, supra, is resumed at steps 1412-1414. Advantageously, by virtue of the doping step 1910, better ohmic contact is facilitated by the heavier p-doping of the exposed tips and upper sidewalls of the PV nanowires 1452.

As an alternative technique or adjunct technique to the doping step 1910, p-doping near the exposed tips and upper sidewalls of the PV nanowires 1452 can be achieved during the PV nanowire growth step 1402, supra, by introducing appropriate p-doping materials into the reactor chamber during the later phases of the VLS synthesis process. Likewise, n-doping near the roots of the PV nanowires 1452 can be achieved during the PV nanowire growth step 1402, supra, by introducing appropriate n-doping materials into the reactor chamber near the initial phases of the VLS synthesis process. By way of example and not by way of limitation, the VLS synthesis process can be carried out in a metalorganic chemical vapor deposition (MOCVD) process, which is sometimes alternatively termed a metalorganic vapor phase epitaxy (MOVPE) process, an organometallic vapor phase epitaxy (OMVPE) process, or an organometallic chemical vapor deposition (OMCVD) process. Exemplary precursors for the InP nanowires can be trimethylindium ($(CH_3)_3In$) and phosphine ($PH_3$). During a first phase of nanowire growth corresponding to the root region, n-type doping can be achieved during the MOCVD process by introducing an Si-containing gas, such as silane ($SiH_4$), or other suitable n-dopant. During a second phase of nanowire growth corresponding to the intrinsic region, no dopants would be introduced. During a third root region phase of nanowire growth corresponding to the tip region, p-type doping can be achieved during the MOCVD process by introducing a metalorganic vapor containing Zn, or other p-type dopants such as Be in a Be-containing metalorganic vapor. In other preferred embodiments, the PV nanowires 1452 can comprise another III-V material such as GaAs, together with suitable associated complementary dopants for the root and tip ends.

A variety of different material systems and doping schemes for the PV nanowires are generally within the scope of the preferred embodiments. In one preferred embodiment consistent with that of FIGS. 14 and 19, the root ends of the PV nanowires 1452 correspond to the n-doped side of the device, while the tip ends correspond to the p-doped side of the device. In alternative preferred embodiments, the root ends of the PV nanowires 1452 can correspond to the p-doped side of the device while the tip ends correspond to the n-doped side of the device.

It has been found particularly advantageous for the PV nanowires 1452 to comprise high-purity intrinsic InP along most or all of their vertical height (length). Thus, for a preferred embodiment in which these InP nanowires have root diameters in the range of 400 nm-750 nm, aspect ratios in the range of 2.0-5.0, and therefore nanowire lengths in the range of 0.8 µm-3.75 µm, high-purity intrinsic InP extends along most or all of the 0.8 µm-3.75 µm length of the nanowire. The photovoltaic character of the overall device is provided by virtue of the tip-side p-i junctions formed with the p-doped a-Si:H layer at the tip end, and the root-side i-n junctions formed with the n-doped a-Si:H layer at the root end.

The long length of the high-purity intrinsic InP region (depletion region) provides an advantageous combination of a high photon-to-carrier conversion efficiency together with a high carrier collection efficiency. The high carrier collection efficiency is facilitated by drift-dominated propagation, with a low impurity-induced recombination rate because of the high purity of the InP material. For one preferred embodiment, the p-doped a-Si:H layer at the tip ends and the n-doped a-Si:H layer at the root ends are separated by at least about 2 µm, and the PV nanowires consist of the high-purity intrinsic InP material along their entire lengths between the p-doped a-Si:H layer and the n-doped a-Si:H layer. The high purity of the InP material is an advantageous by-product of a carefully controlled VLS synthesis process used to grow such InP nanowires. Superior photovoltaic conversion performance is exhibited in comparison to the use of intrinsic semiconductor regions (depletion regions) of lesser length. For reasons including their highly drift-dominated character, PV nanowire-based devices according to one or more preferred embodiments having large i-regions (depletion regions) of about 2 µm are expected to be highly efficient in comparison to conventional solar cells having relatively very thin depletion layers of about 0.2 µm, which is only 10% of 2 µm.

Figure 20:
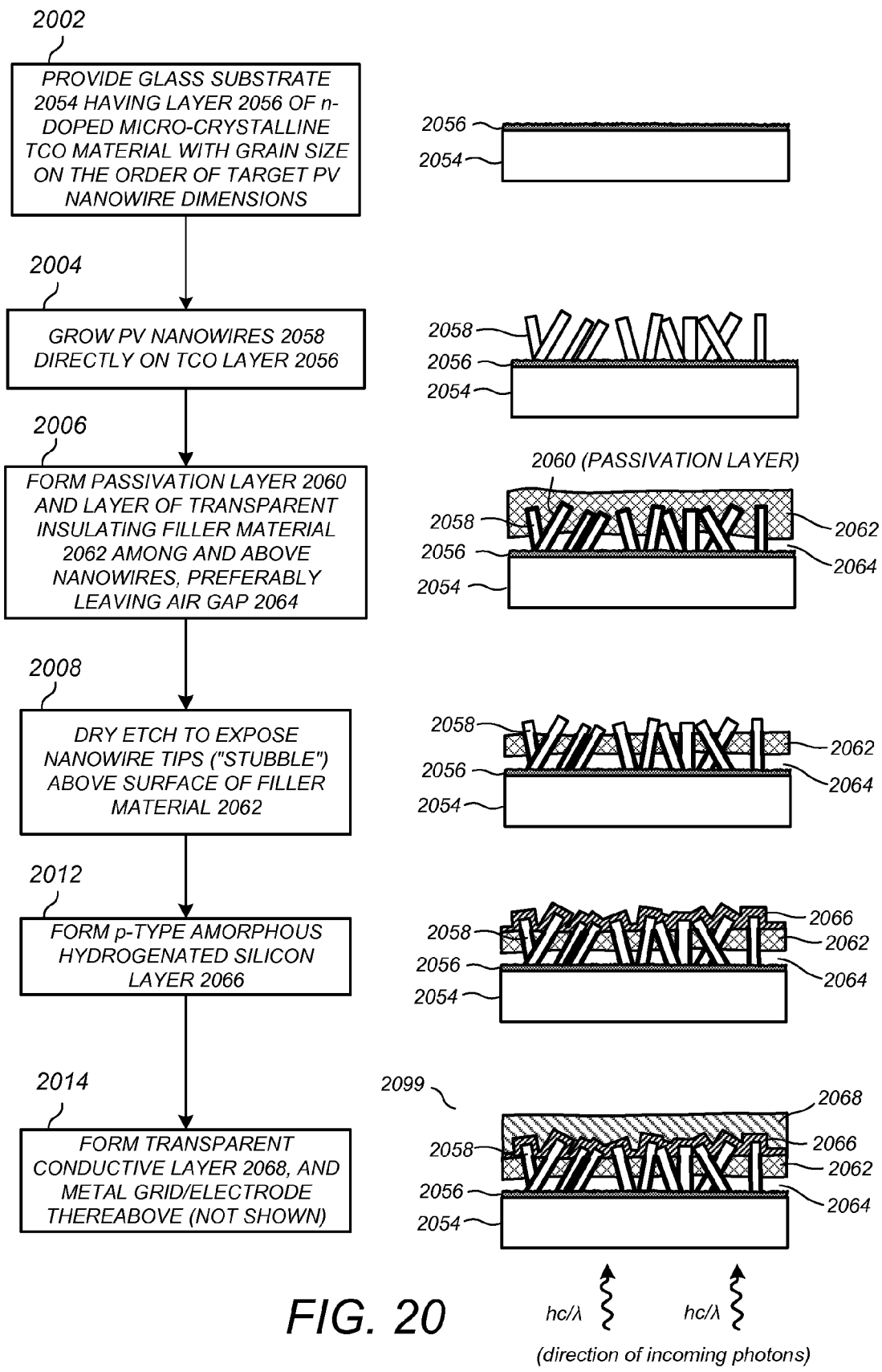
FIG. 20 illustrates fabricating a PV nanowire-based solar cell according to a preferred embodiment.

FIG. 20 illustrates fabrication of a PV nanowire-based solar cell according to a preferred embodiment, along with a side view of the resultant PV nanowire-based solar cell 2099. At step 2002, a glass substrate 2054 is provided, upon which is formed a layer of transparent conductive oxide (TCO) 2056 having a micro-crystalline structure. Consistent with known principles as discussed, for example, in references {6}-{7}, supra, the TCO layer 156 can be formed to be multicrystalline in character with grain sizes in the range of 10 nm-50 nm. The TCO layer 156 is preferably heavily n-doped, so as to provide sufficient conductivity for functionality as a root-side electrode. At step 2004, by extension of principles discussed in U.S. Pat. No. 7,608,530, supra, PV nanowires 2058 are grown directly on the TCO layer 2056, with or without the use of gold catalyst or other catalyst.

Thus, one feature of the preferred embodiment of FIG. 20 is that the PV nanowires 2058 are grown directly on the TCO layer 2056, enabled at least partially by virtue of the short-range atomic order (SRAO) of the TCO material. The preferred embodiment of FIG. 20 provides for the opportunity to have solar light come in through the glass substrate, through the TCO, and onto the PV nanowires without a need for a n-type (or p-type) amorphous Si:H layer. This can simplify the manufacturing process and make fabrication much easier. Notably, it is required to select a TCO material which would not contaminate the nanowires during the nanowire growth. For example, with reference to {6}, supra, In—Sn-Oxide is one such material, and is n-type, and can be formed to have micro-crystalline grains 18-25 nm in size. In an alternative preferred embodiment, a very-thin layer of a-Si:H material having short-range atomic order (SRAO) can be disposed on the TCO layer 2056 prior to PV nanowire formation, for facilitating growth of the PV nanowires. Preferably, the thickness of the layer of a-Si:H material would be 5 nm or less.

Subsequent to the growth of the PV nanowires 2058 at step 2004, remainder of the solar cell fabrication process can proceed according to one or more methods described above, including those of FIGS. 4, 10, 14, and 19. At step 2006, the PV nanowires 2058 are passivated by forming a passivation layer 2060 (which may itself comprise multiple individual passivation layers) on each individual PV nanowire 2058, and then a solid filler layer 2062 is applied, preferably in a manner that leaves an air gap 2064. The passivation layer 2060 can be formed using methods including, but not limited to, atomic layer deposition. At step 2008, the solid filler layer 2062 is subject to a dry etch, such as with O2 plasma, resulting in PV nanowire tips sticking out like whiskers from the solid filler layer 2062. At step 2012, a p-type layer 2066 of amorphous Si:H is deposited on the filler layer by a PECVD process. Finally, at step 2014, a transparent conductive layer 2068 (e.g., comprising tin oxide, indium-tin oxides, zinc oxide, or other substantially conductive and substantially transparent material) is formed above the p-type a-Si:H layer 2066. The transparent conductive layer 2068 can then serve as the tip-side electrode, optionally in conjunction with a sheet-style or grid-style metal electrode (not shown).

The structure of the resultant PV nanowire-based solar cell 2099 can be reversed with respect to dopant profiles without departing from the scope of the present teachings. Thus, in an alternative preferred embodiment, the TCO layer 2056 on the root-electrode side can be heavily p-doped, with the amorphous Si:H layer 2066 on the tip-electrode side being heavily n-doped.

As illustrated at the bottom of FIG. 20, because the substrate 2054 comprises glass, which will generally be transparent to the solar radiation of interest, the PV nanowire-based solar cell 2099 can be oriented such that the incoming solar radiation is incident upon the its root-electrode surface rather than its tip-electrode surface. As described previously in the instant disclosure, this can bring about several practical advantages, and furthermore can open up the possibility for a rich variety of more complex photovoltaic devices, over the use of an opaque substrate.

Figure 21:
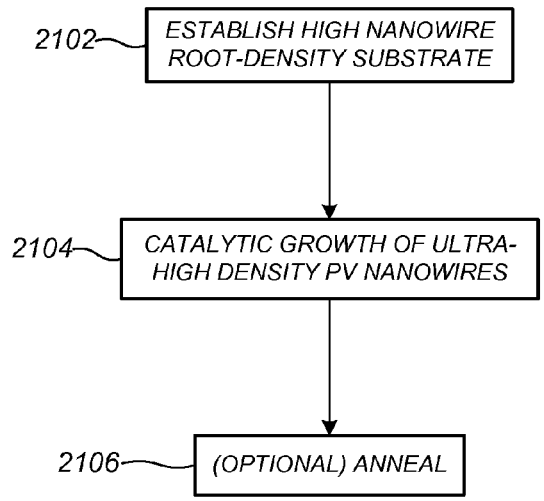
FIG. 21 illustrates fabricating a PV nanowire-based solar cell according to a preferred embodiment.
Figure 22:
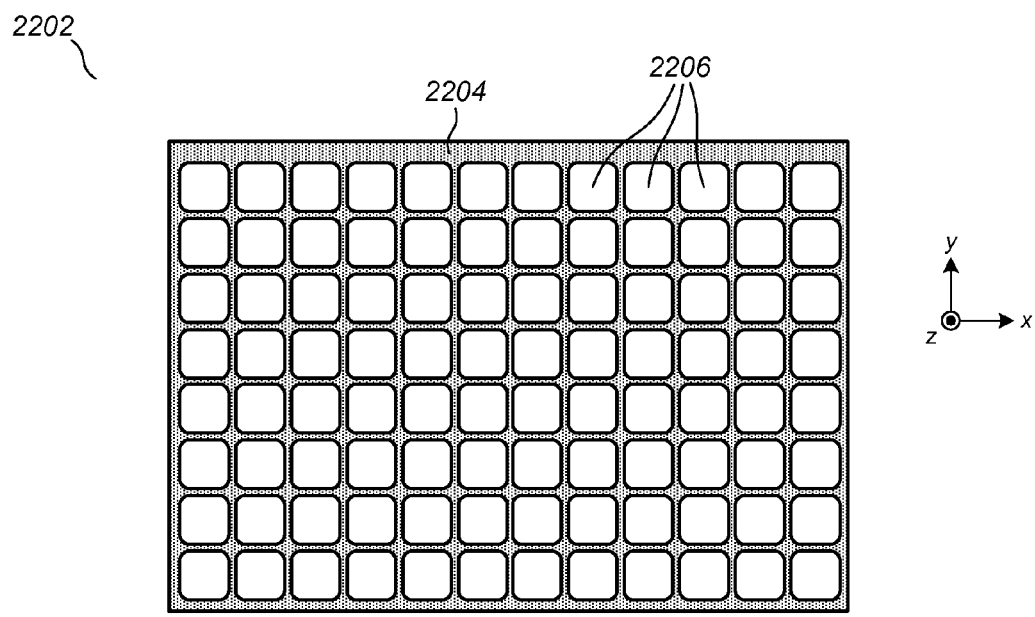
FIG. 22 illustrates a top view of a high root-density substrate including a pattern of catalyst metal islands disposed thereon according to a preferred embodiment.

With reference generally to FIGS. 21-22, according to one preferred embodiment, a PV nanowire-based solar cell is provided with an ultra-high spatial density of PV nanowires over the surface. For one preferred embodiment, at least 50 percent of the substrate area is occupied by the roots of the PV nanowires. For another preferred embodiment, at least 75 percent of the substrate area is occupied by the roots of the PV nanowires, and in yet another preferred embodiment at least 90 percent of the substrate area is occupied by the roots of the PV nanowires. By establishment of such high spatial density of the PV nanowires at their roots, the catalytic growth of the PV nanowires proceeds outwardly from the substrate in an at least partially conjunctive manner that results in a volumetrically dense fabric of crystalline photovoltaic material, the resultant solar cell having improved photon conversion efficiency by virtue of the larger density of crystalline photovoltaic material as compared to conventional (non-dense) PV nanowire arrays, and the resultant solar cell having reduced recombination losses by virtue of a smaller surface area to volume ratio as compared to conventional (non-dense) PV nanowire arrays. According to another preferred embodiment, subsequent to the catalytic growth process, the resultant PV nanowire array is annealed so as to promote and/or further promote lateral fusing processes among the PV nanowires, thereby enriching the crystalline volumetric density and/or fabric-like character of the resultant PV nanowire array.

FIG. 21 illustrates fabrication of a PV nanowire-based solar cell according to a preferred embodiment. At step 2102, a high root-density substrate is established. As used herein, high root-density substrate refers to a substrate that, when subjected to conditions associated with catalytic nanowire growth (e.g., a high-temperature chamber filled with suitable precursor gases), results in the growth of nanowires having a high spatial density at their roots, such as the 50 percent, 75 percent, or 90 percent densities described supra.

FIG. 22 illustrates a top view of one example of a high root-density substrate 2202 according to a preferred embodiment, comprising a silicon substrate 2204 having long-range crystallographic order along its surface (such as a bulk crystalline silicon wafer), and a pattern of catalyst metal islands 2206 disposed thereon. The catalyst islands 2206, which can be formed on the substrate 2204 using a photoimprint lithography process or other suitable method, occupy a lateral percentage of substrate area corresponding to the desired percentage nanowire root density. For the particular preferred embodiment of FIG. 22, which corresponds to an exemplary lateral area percentage of about 80 percent, the catalyst metal islands 2206 are formed with a rounded-square or rounded-rectangular shape so as to achieve the desired percentage lateral coverage. The lateral dimension of each catalyst metal island 2206 can be in the range of 10 nm-500 nm, corresponding to the desired root dimension of the PV nanowires as they grown outwardly from the substrate. With respect to the coordinate system shown in FIG. 22, the PV nanowires grow outwardly from the high root-density substrate 2202 in the +z direction.

According to an alternative preferred embodiment, there is provided a high root-density substrate at step 2102 that does not exhibit long-range crystallographic order along its surface, but that does exhibit short-range atomic order (SRAO). For another preferred embodiment, the high root-density substrate established at step 2102 comprises an otherwise amorphous Si film that has been carefully formed at carefully controlled temperatures to achieve a paracrystalline medium-range order, i.e., a population of crystalline grains in an otherwise disordered matrix, in a manner analogous to that described in {11}, supra. Generally speaking, the distribution of grain sizes will increase as substrate deposition temperature increases. Preferably, the conditions are controlled so as to achieve a high spatial density of crystalline Si grains sized between about 10 nm and 100 nm.

Referring again to FIG. 21, subsequent to step 2102, the PV nanowires are catalytically grown at step 104. By virtue of their high root spatial density, the growth of the PV nanowires proceeds upwardly in an at least partially conjunctive manner that results in a volumetrically dense fabric of crystalline photovoltaic nanowires. As with previously described preferred embodiments, the PV nanowires can be composed of various combinations of indirect bandgap elemental semiconductors and direct and indirect bandgap compound semiconductors consistent with photovoltaic properties.

Referring again to FIG. 22, in one preferred embodiment for which a long-range crystallographic order silicon substrate 2204 is used, that silicon substrate 2204 has a (111) crystallographic order, the catalyst metal islands 2206 comprise indium, the catalytic growth process uses trimethylindium (TMIn) and tertiarybutylphosphine (TBP) as the precursor gases, and the resultant PV nanowires are InP nanowires. A variety of other PV nanowires that are heteroepitaxial vis-à-vis the nanowire material and the substrate material can alternatively be formed without departing from the scope of the preferred embodiments. For example, as discussed in {12}, supra, heteroepitaxy has been observed for ZnO on $Al_2O_3$(110), Ge on Si(100), Ge on Si(111), InP on Si(100), InP on Si(111), InP on Ge(111), GaAs on Si(111), and GaN on $Al_2O_3$(0001).

Referring again to FIG. 21, subsequent to step 2104, the resultant PV nanowire structure is annealed in an optional annealing step 2106. For one preferred embodiment, the annealing process proceeds at a temperature greater than the catalytic growth temperature, but less than the melting temperature, of the PV nanowires. The annealing process promotes lateral fusing processes among the PV nanowires, thereby enriching the crystalline volumetric density and/or fabric-like character of the resultant PV nanowire array.

The resultant solar cell fabricated according to one or more of the preferred embodiments of FIGS. 21-22 can exhibit improved photon conversion efficiency by virtue of the larger density of crystalline photovoltaic material as compared to conventional (non-dense) PV nanowire arrays. The resultant solar cell can further exhibit reduced recombination losses by virtue of a smaller surface area to volume ratio as compared to conventional (non-dense) PV nanowire arrays. An example of what is meant by a conventional non-dense nanowire array (in a non-photovoltaic context) is discussed in {12}, supra. Although the particular atomic-level mechanisms by which nanowires are formed in the VLS growth process may not be thoroughly understood, the physical principles underlying the formation of the large volumetric density, lower surface area-to-volume ratio PV nanowire fabric upon a high nanowire root-density substrate according to the preferred embodiments may be analogous to the physical principals that underlie the formation of photosensitive cesium iodide structures for scintillator screens of x-ray image intensifiers, as described in U.S. Pat. No. 4,287,230 and U.S. Pat. No. 6,429,437, each of which is incorporated by reference herein.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments are not intended to limit their scope, which is limited only by the scope of the claims set forth below.

What is claimed is:

1. A method for fabricating a photovoltaic energy conversion device, comprising:
   providing a substrate including a substrate surface layer;
   growing a plurality of photovoltaic (PV) nanowires outwardly from the substrate surface layer, each PV nanowire having a root end near said substrate surface layer and a tip end opposite said root end; and
   forming a canopy-style tip-side electrode in contact with said tip ends of said PV nanowires, comprising:
   forming a layer of sacrificial material having a surface that covers the tips of the PV nanowires;
   forming a layer of electrically conductive material upon the surface of the layer of sacrificial material; and
   removing said layer of sacrificial material, whereby said layer of electrically conductive material settles into contact with said tip ends of said PV nanowires to form said canopy-style tip-side electrode, and whereby an air gap layer remains that laterally surrounds said PV nanowires between said substrate surface layer and said layer of electrically conductive material;
   wherein said forming the layer of sacrificial material comprises:
   applying a first layer upon the substrate surface layer, said first layer comprising a first liquid that laterally surrounds the PV nanowires;
   applying a second layer comprising a second liquid upon said first layer, wherein said second liquid comprises an uncured sacrificial plastic material that is phobic to said first liquid; and
   allowing said second layer to cure to form said layer of sacrificial material; and
   wherein said removing said layer of sacrificial material comprises:
   evacuating said first layer of said first liquid from between said substrate surface layer and said layer of sacrificial material; and
   wherein said layer of sacrificial material is removed by sublimation.

2. The method of claim 1, wherein said first liquid is a water layer, wherein said second liquid is a lacquer film, and wherein said applying said second layer comprises spraying the lacquer film upon said water layer.

3. The method of claim 1, said substrate surface layer being electrically conductive and forming a root-side electrode of the photovoltaic energy conversion device, wherein said substrate surface layer comprises a short-range atomic order (SRAO) material.

* * * * *